(12) United States Patent
Doris et al.

(10) Patent No.: US 11,189,782 B2
(45) Date of Patent: Nov. 30, 2021

(54) MULTILAYERED BOTTOM ELECTRODE FOR MTJ-CONTAINING DEVICES

(71) Applicant: International Business Machines Corporation, Armonk, NY (US)

(72) Inventors: Bruce B. Doris, Slingerlands, NY (US); Thitima Suwannasiri, Oak Ridge, NJ (US); Nathan P. Marchack, New York, NY (US); Pouya Hashemi, Purchase, NY (US)

(73) Assignee: International Business Machines Corporation, Armonk, NY (US)

( * ) Notice: Subject to any disclaimer, the term of this patent is extended or adjusted under 35 U.S.C. 154(b) by 58 days.

(21) Appl. No.: 16/552,647

(22) Filed: Aug. 27, 2019

(65) Prior Publication Data

US 2021/0066578 A1    Mar. 4, 2021

(51) Int. Cl.
*H01L 43/02* (2006.01)
*H01L 43/12* (2006.01)
*H01L 27/22* (2006.01)

(52) U.S. Cl.
CPC ............ *H01L 43/02* (2013.01); *H01L 27/222* (2013.01); *H01L 43/12* (2013.01)

(58) Field of Classification Search
CPC ....... H01L 27/222; H01L 43/08; H01L 43/12; H01L 43/02; G11C 2211/5615; G11C 11/161; H01F 10/3286–3295; G01R 33/098; G11B 5/3909
USPC ...................................................... 257/427
See application file for complete search history.

(56) References Cited

U.S. PATENT DOCUMENTS

| 7,825,398 | B2 |   | 11/2010 | Happ et al. |
| 8,772,888 | B2 |   | 7/2014 | Jung et al. |
| 9,082,963 | B2 | * | 7/2015 | Gaidis ................. H01F 10/3254 |
| 9,166,154 | B2 |   | 10/2015 | Satoh et al. |
| 9,231,193 | B2 | * | 1/2016 | Iwayama ................ H01L 43/02 |
| 9,502,639 | B2 | * | 11/2016 | Choi ...................... H01L 45/04 |
| 9,716,222 | B1 |   | 7/2017 | Chuang et al. |
| 10,205,089 | B2 | * | 2/2019 | Kim ....................... H01L 43/02 |

(Continued)

FOREIGN PATENT DOCUMENTS

CN    105529344 A    4/2016

OTHER PUBLICATIONS

International Search Report dated Dec. 9, 2020 received in International Application No. PCT/IB2020/057768, 9 pages.

*Primary Examiner* — Khiem D Nguyen
(74) *Attorney, Agent, or Firm* — Scully, Scott, Murphy & Presser, P.C.; Daniel P. Morris, Esq.

(57) ABSTRACT

A multilayered bottom electrode for a magnetic tunnel junction (MTJ) containing device is provided that includes, from bottom to top, a base segment having a first diameter and composed of a remaining portion of a first bottom electrode metal-containing layer, a middle segment having a second diameter and composed of a remaining portion of a second bottom electrode metal-containing layer, and an upper segment having a third diameter and composed of a remaining portion of a third bottom electrode metal-containing layer, wherein the first diameter is greater than the second diameter, and the third diameter is equal to, or less than, the second diameter. The wider base segment of each multilayered bottom electrode prevents tilting and/or bowing of the resultant bottom electrode. Thus, a stable bottom electrode is provided.

9 Claims, 15 Drawing Sheets

(56) References Cited

U.S. PATENT DOCUMENTS

| | | | |
|---|---|---|---|
| 2013/0161768 A1* | 6/2013 | Khvalkovskiy | H01F 10/3286 257/421 |
| 2014/0042567 A1* | 2/2014 | Jung | H01L 43/08 257/421 |
| 2014/0210103 A1* | 7/2014 | Satoh | H01L 27/222 257/774 |
| 2015/0069480 A1* | 3/2015 | Kanaya | G11C 11/16 257/295 |
| 2015/0295165 A1* | 10/2015 | Annunziata | H01L 43/08 257/421 |
| 2015/0311429 A1* | 10/2015 | Li | H01L 43/08 257/421 |
| 2016/0118577 A1* | 4/2016 | Chen | H01L 43/10 257/421 |
| 2017/0033282 A1* | 2/2017 | Wang | H01L 43/12 |
| 2017/0263855 A1 | 9/2017 | Nagamine et al. | |
| 2018/0033957 A1* | 2/2018 | Zhang | H01L 43/12 |
| 2018/0358070 A1* | 12/2018 | Song | G11C 11/161 |
| 2019/0206928 A1* | 7/2019 | Li | H01L 43/08 |
| 2020/0027920 A1* | 1/2020 | Miura | H01L 43/02 |

* cited by examiner

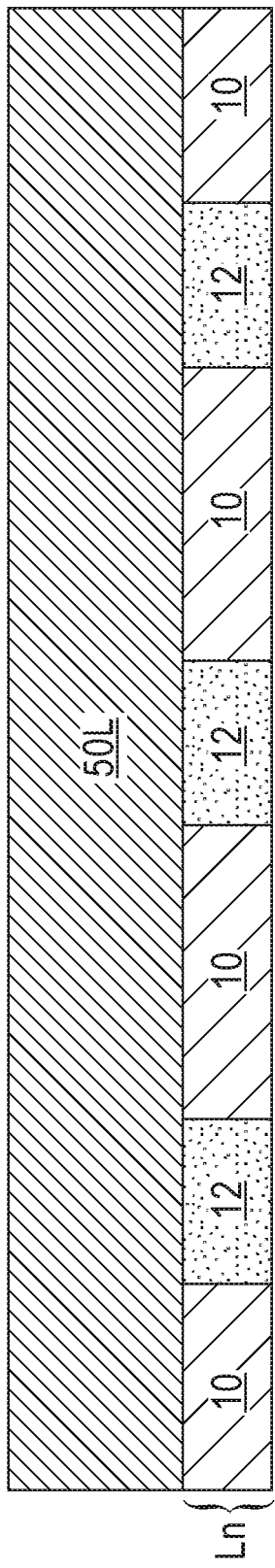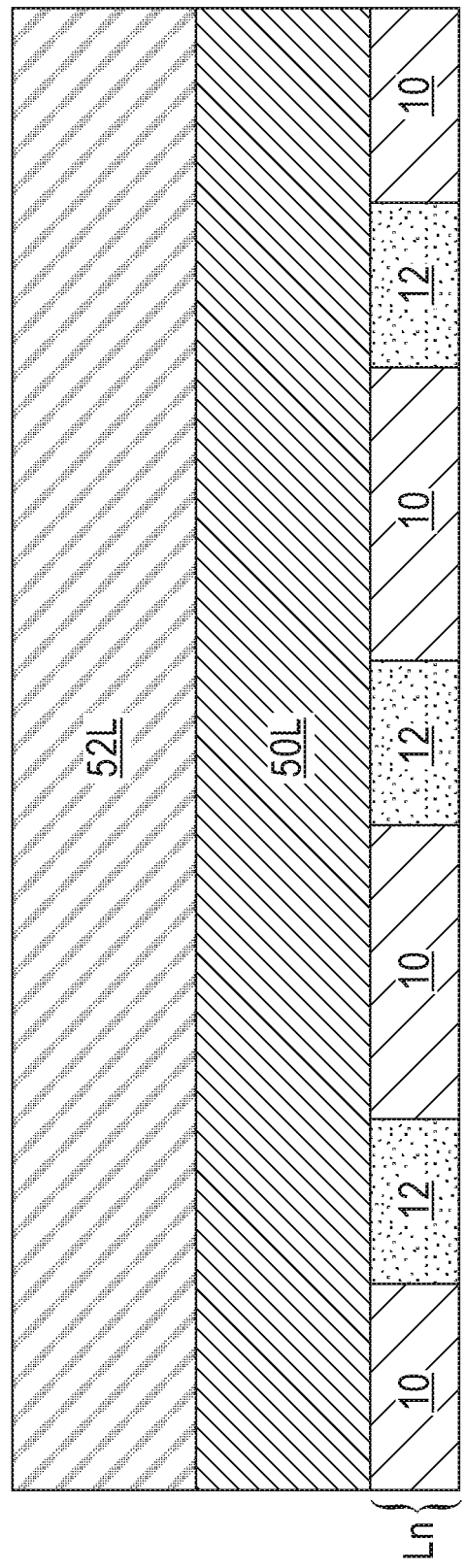

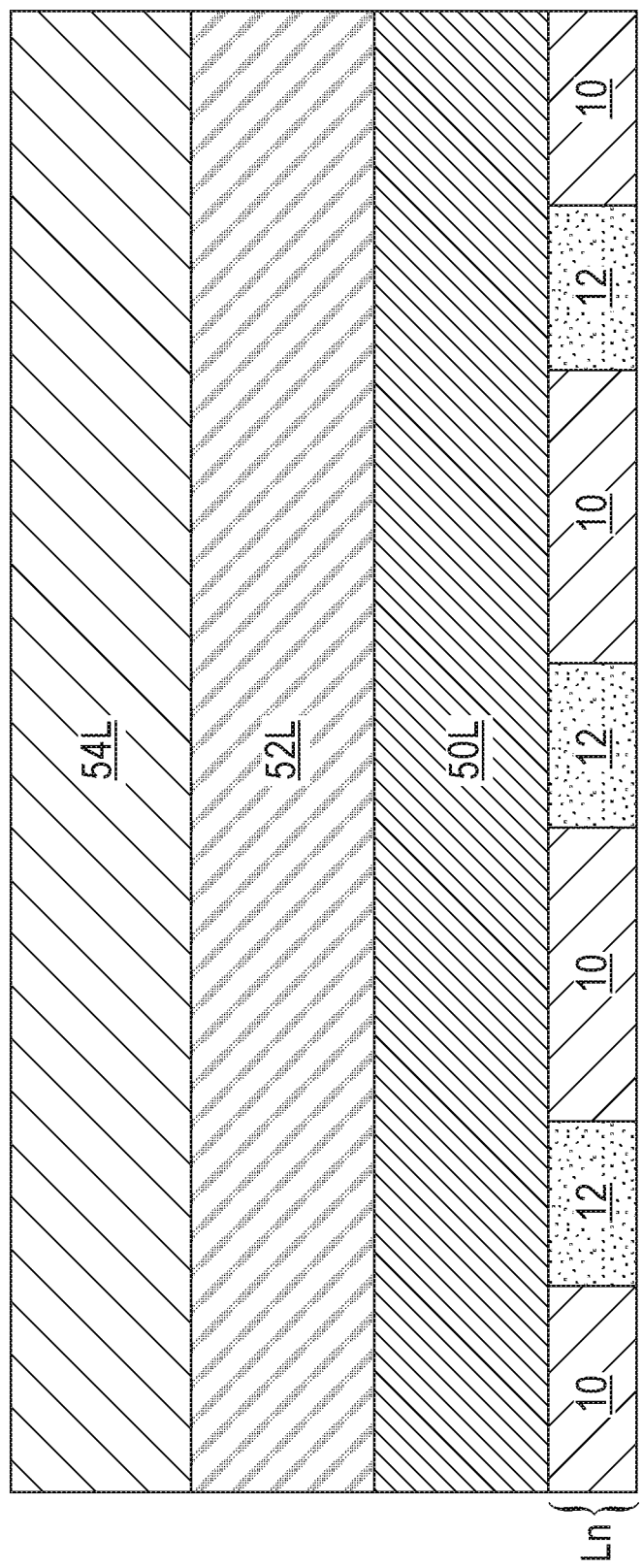

MULTILAYERED BOTTOM ELECTRODE FOR MTJ-CONTAINING DEVICES

BACKGROUND

The present application relates to a memory structure and a method of forming the same. More particularly, the present application relates to a magnetoresistive random access memory (MRAM) structure which has a stable multilayered bottom electrode which, in some embodiments, has a high aspect ratio.

MRAM is a non-volatile random access memory technology in which data is stored by magnetic storage elements. These elements are typically formed from two ferromagnetic plates, each of which can hold a magnetization, separated by a thin dielectric layer (i.e., a tunnel barrier). One of the two plates is a permanent magnetic set to a particular polarity (i.e., a magnetic reference layer); the other plate's magnetization can be changed to match that of an external field to store memory (i.e., a magnetic free layer). Such a configuration is known as a magnetic tunnel junction (MTJ) pillar. In leading-edge or neuromorphic computing systems, a MTJ pillar is typically embedded within a back-end-of-the-line (BEOL) structure.

In the manufacturing of a MRAM device, blanket layers of MTJ pillar materials (i.e., a magnetic reference material, a tunnel barrier, a magnetic free material and a MTJ cap material) and a top electrode material are formed upon a bottom electrode of the MRAM device. The blanket layers are then patterned by lithography and etching to provide a material stack of a multilayered MTJ pillar (including remaining portions of the magnetic reference material, the tunnel barrier, the magnetic free material, and the MTJ cap material) and a top electrode located on the bottom electrode.

Small bottom electrodes are key to yielding MTJ pillars with no sidewall residue. Ideally, the bottom electrode is well aligned with the MTJ pillar, and smaller than the MTJ pillar so that the bottom electrode is completely underneath the MTJ pillar. The bottom electrode also needs to be of a substantial height so that a sufficient dielectric thickness exists to allow for overetching of the MTJ material stack and cleaning of the MTJ pillar sidewall without reaching the underlying metal layers. For aggressively scaled MTJ pillars this results in a high aspect ratio bottom electrode feature (i.e., a height to diameter ratio of greater than 2 to 1). As the critical dimensions (CDs) approach 20 nm, the stability of the MTJ pillar is compromised and tilting and/or bowing of the bottom electrode is observed.

There is a need to provide a bottom electrode for use in a MRAM device containing a MTJ pillar in which the bottom electrode is stable (i.e., little or no tilting and/or bowing is observed).

SUMMARY

A multilayered bottom electrode for a magnetic tunnel junction (MTJ) containing device is provided that includes, from bottom to top, a base segment having a first diameter and composed of a remaining portion of a first bottom electrode metal-containing layer, a middle segment having a second diameter and composed of a remaining portion of a second bottom electrode metal-containing layer, and an upper segment having a third diameter and composed of a remaining portion of a third bottom electrode metal-containing layer, wherein the first diameter is greater than the second diameter, and the third diameter is equal to, or less than, the second diameter. The wider base segment of each multilayered bottom electrode prevents tilting and/or bowing of the resultant bottom electrode. Thus, a stable bottom electrode is provided.

In one aspect of the present application, a memory structure is provided. In one embodiment, the memory structure includes a multilayered bottom electrode located on a surface of an electrically conductive structure that is embedded in a first interconnect dielectric material layer, wherein the multilayered bottom electrode includes a tapered base segment having a first diameter and composed of first conductive material, a middle segment having a second diameter and composed of a second conductive material that is compositionally different from the first conductive material, and an upper segment having a third diameter and composed of a third conductive material that is compositionally different from the second conductive material, wherein the first diameter is greater than the second diameter, and the third diameter is equal to, or less than, the second diameter. A second interconnect dielectric material layer is located laterally adjacent to the multilayered bottom electrode. A magnetic tunnel junction (MTJ) pillar is located on a topmost surface of the upper segment of the multilayered bottom electrode, and a top electrode is located on the MTJ pillar.

In another embodiment, the memory structure includes a multilayered bottom electrode located on a surface of an electrically conductive structure that is embedded in a first interconnect dielectric material layer, wherein the multilayered bottom electrode includes a base segment having a first diameter and composed of first conductive material, a middle segment having a second diameter and composed of a second conductive material that is compositionally different from the first conductive material, and an upper segment having a third diameter and composed of a third conductive material that is compositionally different from the first conductive material and the second conductive material, wherein the first diameter is greater than the second diameter, and the third diameter is less than both the first diameter and the second diameter. A second interconnect dielectric material layer is located laterally adjacent to the multilayered bottom electrode. A magnetic tunnel junction (MTJ) pillar is located on a topmost surface of the upper segment of the multilayered bottom electrode, and a top electrode is located on the MTJ pillar.

In another aspect of the present application, a method of forming a memory structure is provided. In one embodiment, the method includes forming a structure that includes an interconnect level that includes an electrically conductive structure embedded in a first interconnect dielectric material layer, a first bottom electrode metal-containing layer located on the interconnect level, a second bottom electrode metal-containing layer located on the first bottom electrode metal-containing layer, a third bottom electrode metal-containing layer located on the second bottom electrode metal-containing layer, wherein the second bottom electrode metal-containing layer is composed a conductive material that has a different etch rate than a conductive material of both the first bottom electrode metal-containing layer and the third bottom electrode metal-containing layer, and a dielectric hard mask layer on the third bottom electrode metal-containing layer. Next, a patterned mask is formed on the dielectric hard mask layer, wherein the patterned mask is located above the electrically conductive structure embedded in the first interconnect dielectric material layer. The dielectric hard mask layer and the third bottom electrode metal-containing layer are then patterned using a first etch and the patterned mask as an etch mask to provide a first patterned material stack, the first patterned material stack includes a dielectric hard mask material portion and a third bottom electrode metal-containing portion. Next, a second etch is performed to provide a multilayered bottom electrode, wherein the multilayered bottom electrode includes, from bottom to top, a tapered base segment having a first diameter and composed of a remaining portion of the first bottom electrode metal-containing layer, a middle segment having a second diameter and composed of a remaining portion of the second bottom electrode metal-containing layer, and an upper segment having a third diameter and composed of a remaining portion of the third bottom electrode metal-containing portion, wherein the first diameter is greater than the second diameter, and the third diameter is equal to, or less than, the second diameter.

In another embodiment, the method includes forming a structure that includes an interconnect level that includes an electrically conductive structure embedded in a first interconnect dielectric material layer, a first bottom electrode metal-containing layer located on the interconnect level, a second bottom electrode metal-containing layer located on the first bottom electrode metal-containing layer, wherein the second bottom electrode metal-containing layer has a higher lateral trim rate than the first bottom electrode metal-containing layer, a third bottom electrode metal-containing layer located on the second bottom electrode metal-containing layer, wherein the third bottom electrode metal-containing layer has a higher lateral trim rate than the second bottom electrode metal-containing layer, and a dielectric hard mask layer located on the third bottom electrode metal-containing layer. A patterned mask is then formed on the dielectric hard mask layer, wherein the patterned mask is located above the electrically conductive structure embedded in the first interconnect dielectric material layer. Next, a pattern provided by the patterned mask is transferred into the dielectric hard mask layer to provide a dielectric hard mask beneath the patterned mask. Each of the first bottom electrode metal-containing layer, the second bottom metal-containing layer, and the third bottom electrode metal-containing layer is then patterned utilizing the patterned hard mask as an etch mask to provide a multilayered bottom electrode, wherein the multilayered bottom electrode includes, from bottom to top, a base segment having a first diameter and composed of a remaining portion of the first bottom electrode metal-containing layer, a middle segment having a second diameter and composed of a remaining portion of the second bottom electrode metal-containing layer, and an upper segment having a third diameter and composed of a remaining portion of the third bottom electrode metal-containing layer, wherein the first diameter is greater than the second diameter, and the third diameter less is than both the first diameter and the second diameter.

In either of the method embodiments mentioned above, a second interconnect dielectric material layer can be formed laterally adjacent to the multilayered bottom electrode, another patterned material stack can be formed on the second interconnect dielectric material layer, wherein the another patterned material stack contacts a topmost surface of the upper segment of the bottom electrode and includes a magnetic tunnel junction (MTJ) pillar and a top electrode. In some embodiments, an encapsulation liner and a third interconnect dielectric material layer are formed laterally adjacent to the second patterned material stack.

BRIEF DESCRIPTION OF THE DRAWINGS

FIG. 10 is a cross sectional view of an exemplary structure that can be employed in accordance with another embodiment of the present application, wherein the exemplary structure includes a first bottom electrode metal-containing layer located on a surface of an interconnect level that includes electrically conductive structures embedded in a first interconnect dielectric material layer.

FIG. 11 is a cross sectional view of the exemplary structure of FIG. 10 after forming a second bottom electrode metal-containing layer on the first bottom electrode metal-containing layer, wherein the second bottom electrode metal-containing layer has a higher lateral trim rate than the first bottom electrode metal-containing layer.

FIG. 12 is a cross sectional view of the exemplary structure of FIG. 11 after forming a third bottom electrode metal-containing layer on the second bottom electrode metal-containing layer, wherein the third bottom electrode metal-containing layer has a higher lateral trim rate than the second bottom electrode metal-containing layer.

DETAILED DESCRIPTION

Figure 1:
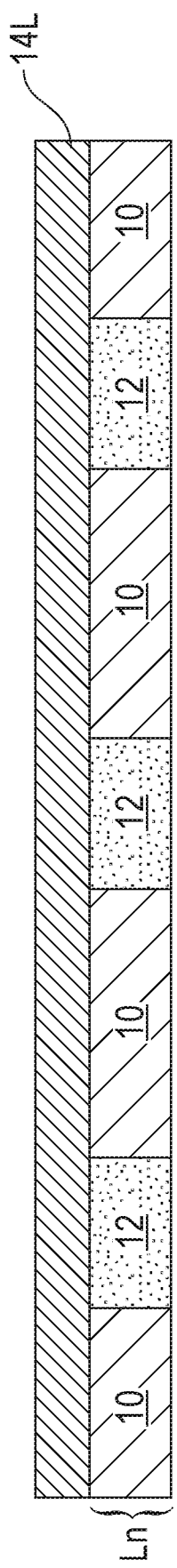
FIG. 1 is a cross sectional view of an exemplary structure that can be employed in accordance with an embodiment of the present application, wherein the exemplary structure includes a first bottom electrode metal-containing layer located on a surface of an interconnect level that includes electrically conductive structures embedded in a first interconnect dielectric material layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

It is noted that the drawings of the present application illustrate a memory device area in which a memory structure such as, for example, a MRAM, will be formed. A non-memory device area may be located laterally adjacent to the memory device area illustrated in the drawings of the present application. It is further noted that although the present application describes and illustrates forming a plurality of bottom electrodes for a memory array, the present application contemplates embodiments in which a single bottom electrode for a single memory structure is formed.

Referring first to FIG. 1, there is illustrated an exemplary structure that can be employed in accordance with an embodiment of the present application. The exemplary structure of FIG. 1 includes a first bottom electrode metal-containing layer 14L located on a surface of an interconnect level, $L_n$, that includes electrically conductive structures 12 embedded in a first interconnect dielectric material layer 10.

Although not illustrated in the drawings, a metal level can be located beneath interconnect level, $L_n$. In some embodiments, and when n is 1, the metal level is a middle-of-the-line (MOL) level. In other embodiments, and when n is 2, 3, 4, etc, the metal level is a lower interconnect level that is positioned beneath interconnect level, $L_n$. In either embodiment, the metal level includes a dielectric material layer that contains at least one metal level electrically conductive structure embedded therein that is connected, either directly or indirectly, to an underlying CMOS device (not shown) that is present in a front-end-of-the-line (FEOL) level (also not shown).

When n is 1, the dielectric material layer of the metal level can be composed of a MOL dielectric material such as, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0 (all dielectric constants expressed herein are measured in a vacuum). Also, and in such an embodiment (i.e., when n is 1), the at least one metal level electrically conductive structure is a contact structure that includes a contact metal or a contact metal alloy such as, for example, tungsten (W), cobalt (Co), platinum (Pt), nickel (Ni) or alloys thereof.

When n is greater than 1, the dielectric material layer of the metal level can be composed of an interconnect dielectric material such as, for example, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. Also, and in such an embodiment (i.e., when n is greater than 1), the at least one metal level electrically conductive structure is composed of an electrically conductive metal or an electrically conductive metal alloy. Examples of electrically conductive materials that can be used in the present application include copper (Cu), aluminum (Al), or tungsten (W), while an example of an electrically conductive metal alloy is a Cu—Al alloy.

The first interconnect dielectric material layer 10 of interconnect level, $L_n$, can be composed of one of the interconnect dielectric materials mentioned above for the dielectric material layer of the metal level. The electrically conductive structures 12 that are embedded in the first interconnect dielectric material layer 10 can be composed of one of the electrically conductive metals or metal alloys mentioned above for the at least one metal level electrically conductive structure.

In some embodiments, a diffusion barrier liner (not shown) is formed along the sidewall and a bottom wall of the electrically conductive structure 12. In some embodiments and as illustrated in FIG. 1, no diffusion barrier liner(s) is(are) present. The diffusion barrier liner is composed of a diffusion barrier material (i.e., a material that serves as a barrier to prevent a conductive material such as copper from diffusing there through). Examples of diffusion barrier materials that can be used in providing the diffusion barrier liner include, but are not limited to, Ta, TaN, Ti, TiN, Ru, RuN, RuTa, RuTaN, W, or WN. In some embodiments, the diffusion barrier material can include a material stack of diffusion barrier materials. In one example, the diffusion barrier material can be composed of a stack of Ta/TaN.

The metal level and interconnect level, $L_n$, can be formed utilizing conventional processes that are well-known to those skilled in the art. So as to not obscure the method of the present application, the techniques used to form the metal level and interconnect level, $L_n$, are not provided herein. In one embodiment, a damascene process can be used in forming both the metal level and interconnect level, $L_n$. A damascene process can include forming an opening into a dielectric material, filling the opening with either a contact-metal containing material or an electrically conductive metal-containing material and, if needed, performing a planarization process such as, for example, chemical mechanical polishing (CMP) and/or grinding. In some embodiments, each electrically conductive structure 12 has a topmost surface that is coplanar with a topmost surface of the first interconnect dielectric material layer 10.

After forming interconnect level, $L_n$, the first bottom electrode metal-containing layer 14L is formed on the interconnect level, $L_n$; the first bottom electrode metal-containing layer 14L is a continuous layer that is formed over an entirety of the interconnect level, $L_n$. As is illustrated in FIG. 1, the first bottom electrode metal-containing layer 14L is formed on the first interconnect dielectric material layer 10 as well as on each electrically conductive structure 12.

The first bottom electrode metal-containing layer 14L is composed of a first conductive material including, but are not limited to, Al, Ta, TaN, Ti, TiN, Ru, RuN, RuTa, RuTaN, Co, CoWP, CoN, W or WN. The first bottom electrode metal-containing layer 14L has a first thickness that can be from 10 nm to 100 nm. In one example, the first bottom electrode metal-containing layer 14L is composed of one of TaN, TiN or W and has a first thickness from 20 nm to 30 nm. The first bottom electrode metal-containing layer 14L can be formed by a deposition process such as, for example, sputtering, chemical vapor deposition (CVD), or plasma enhanced chemical vapor deposition (PECVD).

Figure 2:
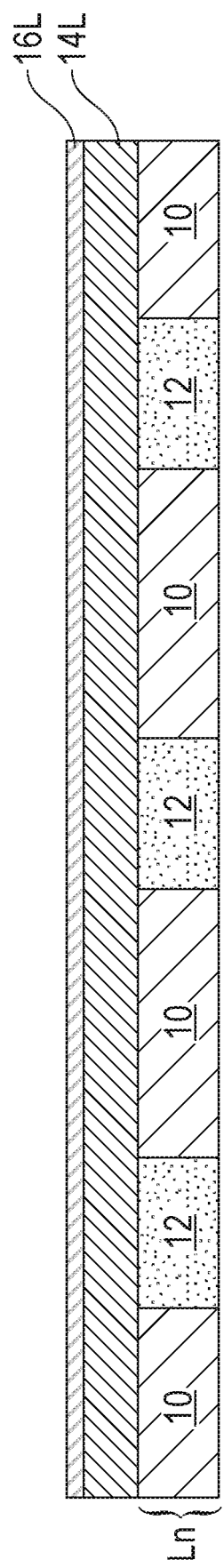
FIG. 2 is a cross sectional view of the exemplary structure of FIG. 1 after forming a second bottom electrode metal-containing layer on the first bottom electrode metal-containing layer.

Referring now to FIG. 2, there is illustrated the exemplary structure of FIG. 1 after forming a second bottom electrode metal-containing layer 16L on the first bottom electrode metal-containing layer 14L. As is shown in FIG. 2, the second bottom electrode metal-containing layer 16L is a continuous layer that is formed on an entirety of the first bottom electrode metal-containing layer 14L.

The second bottom electrode metal-containing layer 16L is composed of a second conductive material that is compositionally different from the first conductive material that provides the first bottom electrode metal-containing layer 14L. Thus, the second bottom electrode metal-containing layer 16L has a different etch rate than the first bottom electrode metal-containing layer 14L. Exemplary second conductive materials that can be used in providing the second bottom electrode metal-containing layer 16L include, but are not limited to, Al, Ta, TaN, Ti, TiN, Ru, RuN, RuTa, RuTaN, Co, CoWP, CoN, W or WN. The second bottom electrode metal-containing layer 16L has a second thickness that is less than the first thickness. In one embodiment, the second thickness is from 1 nm to 20 nm. In one example, and when the first bottom electrode metal-containing layer 14L is composed of one of TaN, TiN or W and has a first thickness from 20 nm to 30 nm, the second bottom electrode metal-containing layer 16L is composed of Ru and has a second thickness from 5 nm to 10 nm. The second bottom electrode metal-containing layer 16L can be formed by a deposition process such as, for example, sputtering, chemical vapor deposition (CVD), or plasma enhanced chemical vapor deposition (PECVD).

Figure 3:
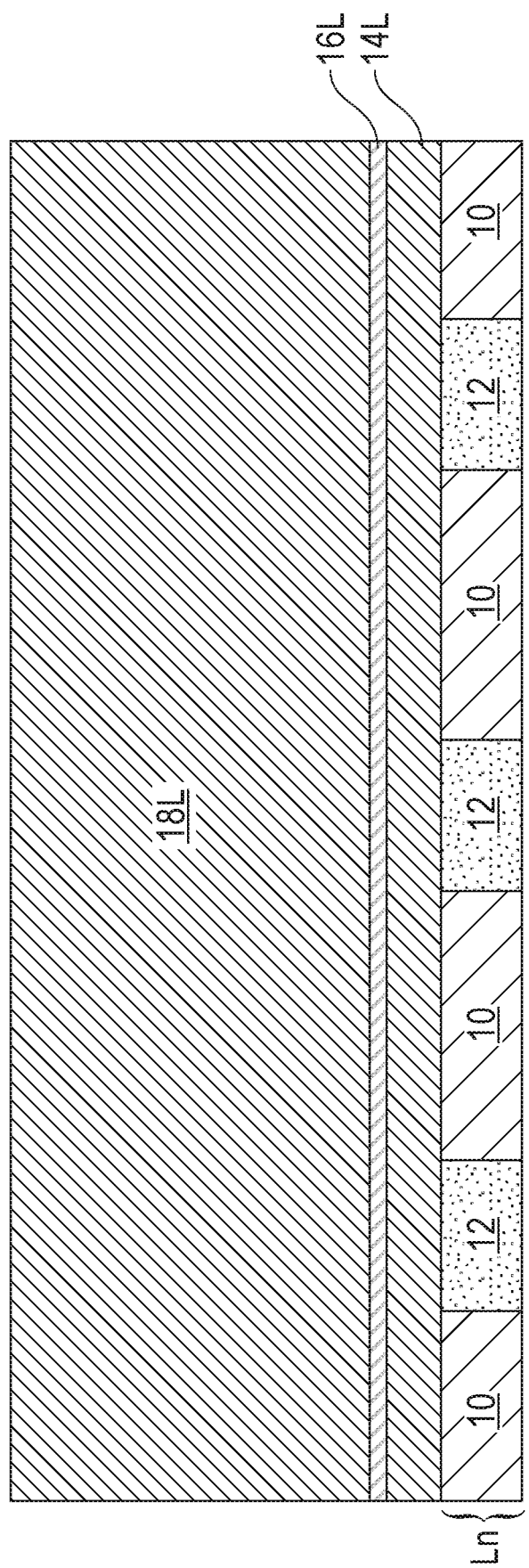
FIG. 3 is a cross sectional view of the exemplary structure of FIG. 2 after forming a third bottom electrode metal-containing layer on the second bottom electrode metal-containing layer.

Referring now to FIG. 3, there is illustrated the exemplary structure of FIG. 2 after forming a third bottom electrode metal-containing layer 18L on the second bottom electrode metal-containing layer 16L. As is shown in FIG. 3, the third bottom electrode metal-containing layer 18L is a continuous layer that is formed on an entirety of the second bottom electrode metal-containing layer 16L.

The third bottom electrode metal-containing layer 18L is composed of a third conductive material that is compositionally different from at least the second conductive material that provides the second bottom electrode metal-containing layer 16L. The third conductive material which provides the third bottom electrode metal-containing layer 18L can be compositionally the same as, or compositionally different from, the first conductive material that provides the first bottom electrode metal-containing layer 14L. The third bottom electrode metal-containing layer 18L thus has a different etch rate than the second bottom electrode metal-containing layer 16L; the etch rate of the third bottom electrode metal-containing layer 18L may be the same as, or different from, the etch rate of the first bottom electrode metal-containing layer 14L. Exemplary third conductive materials that can be used in providing the third bottom electrode metal-containing layer 18L include, but are not limited to, Al, Ta, TaN, Ti, TiN, Ru, RuN, RuTa, RuTaN, Co, CoWP, CoN, W or WN. The third bottom electrode metal-containing layer 16L has a third thickness, which is greater than the second thickness and the first thickness mentioned above. In one example, the third thickness is from 100 nm to 300 nm. In one example, and when the first bottom electrode metal-containing layer 14L is composed of one of TaN, TiN or W and has a first thickness from 20 nm to 30 nm and the second bottom electrode metal-containing layer 16L is composed of Ru and has a second thickness from 5 nm to 10 nm, the third bottom electrode metal-containing layer 18L is composed of one of TaN, TiN or W and has a third thickness from 150 nm to 225 nm. The third bottom electrode metal-containing layer 18L can be formed by a deposition process such as, for example, sputtering, chemical vapor deposition (CVD), or plasma enhanced chemical vapor deposition (PECVD).

Figure 4:
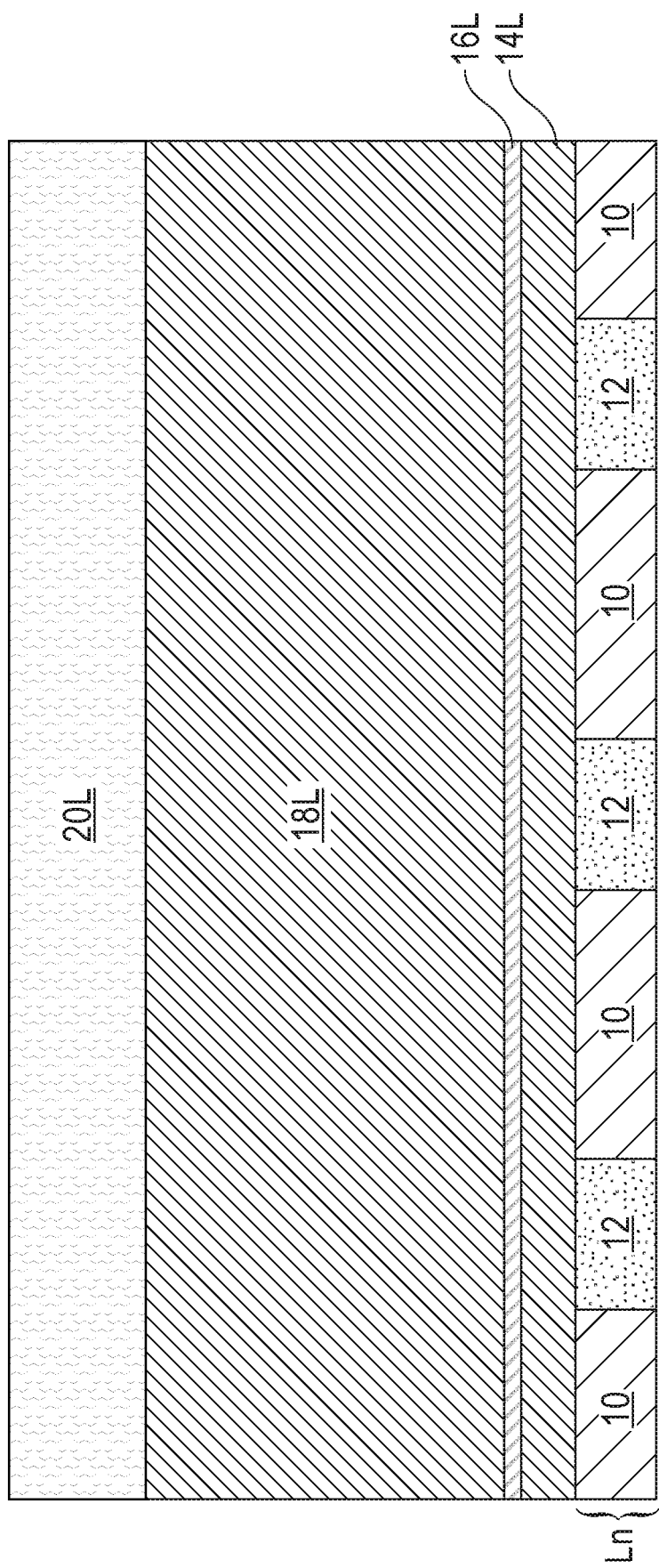
FIG. 4 is a cross sectional view of the exemplary structure of FIG. 3 after forming a dielectric hard mask layer on the third bottom electrode metal-containing layer.

Referring now to FIG. 4, there is illustrated the exemplary structure of FIG. 3 after forming a dielectric hard mask layer 20L on the third bottom electrode metal-containing layer 18L. The dielectric hard mask layer 20L is a continuous layer that covers an entirety of the third bottom electrode metal-containing layer 18L. The dielectric hard mask layer 20L is composed of a dielectric hard mask material including, for example, silicon dioxide, silicon oxynitride, silicon nitride, or any combination thereof.

In some embodiments, the dielectric hard mask layer 20L can be formed utilizing a deposition process such as, for example, chemical vapor deposition (CVD), or plasma enhanced chemical vapor deposition (PECVD). The dielectric hard mask layer 20L can have a thickness from 50 nm to 150 nm; although other thicknesses for the dielectric hard mask layer 20L are contemplated and can be used in the present application.

Figure 5:
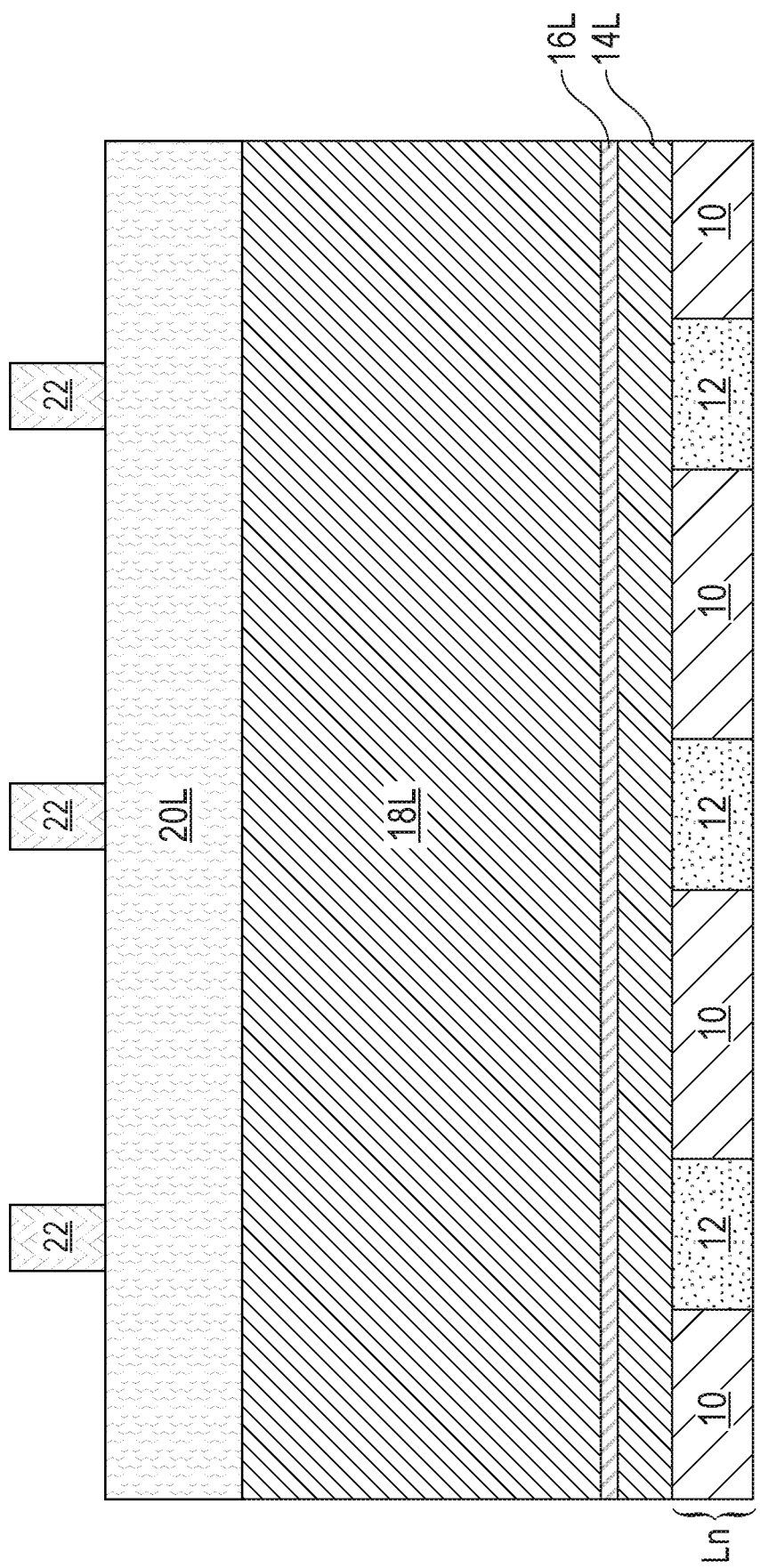
FIG. 5 is a cross sectional view of the exemplary structure of FIG. 4 after forming a plurality of patterned masks on the dielectric hard mask layer, wherein each patterned mask is located above one of the electrically conductive structures embedded in the first interconnect dielectric material layer.

Referring now to FIG. 5, there is illustrated the exemplary structure of FIG. 4 after forming a plurality of patterned masks 22 on the dielectric hard mask layer 20L, wherein each patterned mask 22 is located above one of the electrically conductive structures 12 embedded in the first interconnect dielectric material layer 10. Each patterned mask 22 is spaced apart from a neighboring mask and is composed of a photoresist material such as, for example, a positive-tone photoresist material, a negative-tone photoresist material or a hybrid-tone photoresist material.

Each patterned mask 22 can be formed by lithography. Lithography includes applying a photoresist material to a material or material stack that needs to be patterned, exposing the photoresist material to a desired pattern of irradiation and developing the exposed photoresist material utilizing a conventional resist developer. The photoresist material may be applied utilizing a deposition process such as, for example, chemical vapor deposition (CVD), plasma enhanced chemical vapor deposition (PECVD) or spin-on coating.

Figure 6:
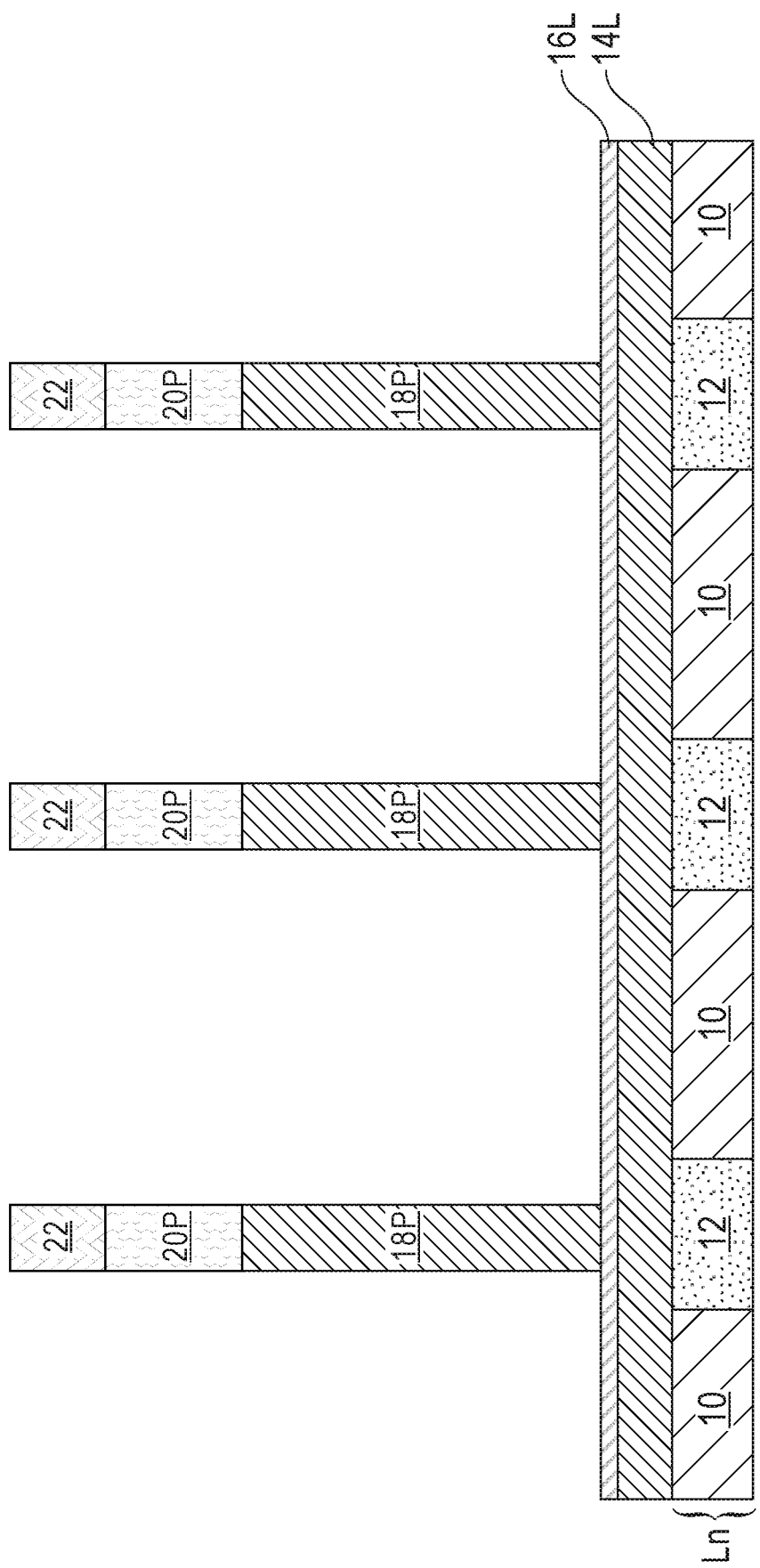
FIG. 6 is a cross sectional view of the exemplary structure after patterning the dielectric hard mask layer and the third bottom electrode metal-containing layer using a first etch and the patterned masks as etch masks to provide a plurality of first patterned material stacks, each first patterned material stack includes a dielectric hard mask material portion and a third bottom electrode metal-containing portion.

Referring now to FIG. 6, there is illustrated the exemplary structure after patterning the dielectric hard mask layer 20L and the third bottom electrode metal-containing layer 18L using a first etch and the patterned masks 22 as etch masks to provide a plurality of first patterned material stacks, each first patterned material stack includes a dielectric hard mask material portion 20P and a third bottom electrode metal-containing portion 18P. The first etch stops on the second bottom electrode metal-containing layer 16L. In one embodiment, the first etch is a reactive ion etch (RIE). In another embodiment, the first etch is a plasma etch.

The dielectric hard mask material portion 20P of each first patterned material stack is composed of a remaining (i.e., non-etched) portion of the dielectric hard mask layer 20L, while the third bottom electrode metal-containing portion 18P is composed of a remaining (i.e., non-etched) portion of the third bottom electrode metal-containing layer 18L. The outermost sidewall of the dielectric hard mask material portion 20P is vertically aligned to the outermost sidewall of the third bottom electrode metal-containing portion 18P. In some embodiments, each first patterned material stack (18P/20P) has a width (i.e., diameter) that is equal to, or less than, a width (i.e., diameter) of an underlying electrically conductive structure 12.

After the first etch, each patterned mask 22 can be removed from the first patterned material stack (18P/20P) utilizing a material removal process such as, for example, etching or planarization (i.e., chemical mechanical polishing (CMP) or grinding). Each patterned mask 22 can be removed prior to, or after, patterning of the second bottom electrode-metal-containing layer 16L and the first bottom electrode metal containing layer 14L.

Figure 7:
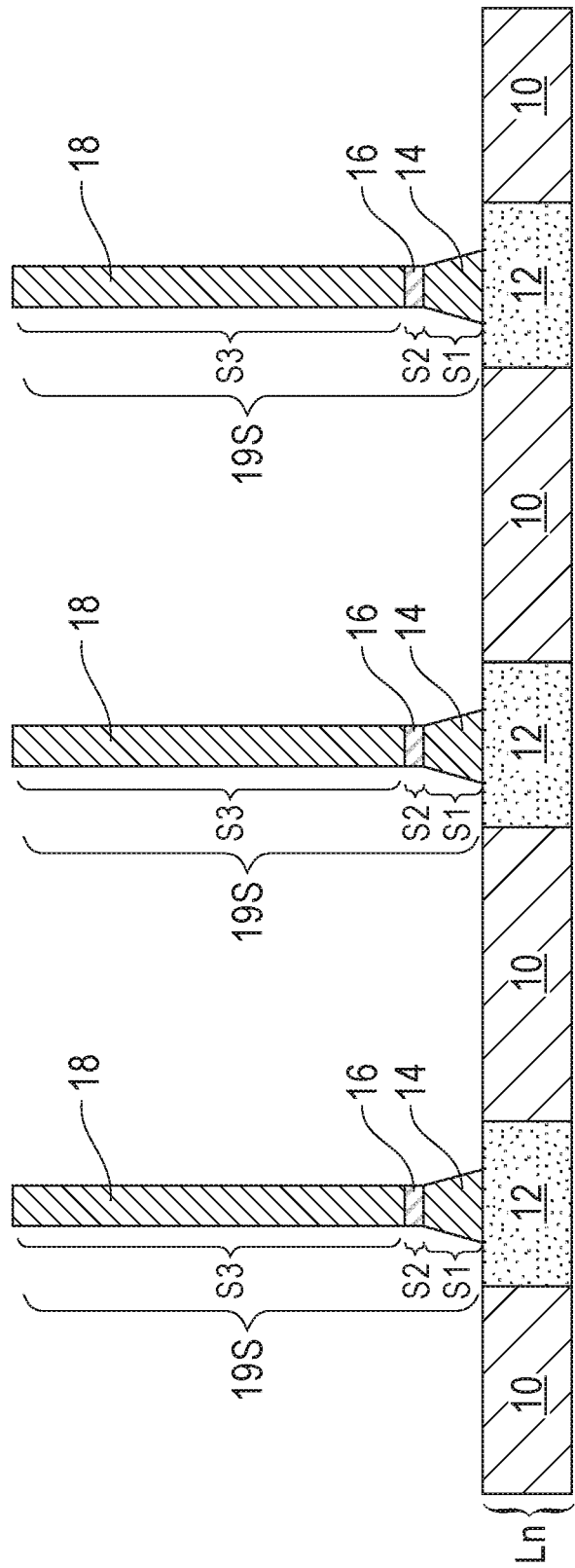
FIG. 7 is a cross sectional view of the exemplary structure of FIG. 6 after performing a second etch to provide a plurality of multilayered bottom electrodes, wherein each multilayered bottom electrode includes, from bottom to top, a tapered base segment having a first diameter and composed of a remaining portion of the first bottom electrode metal-containing layer, a middle segment having a second diameter and composed of a remaining portion of the second bottom electrode metal-containing layer, and an upper segment having a third diameter and composed of a remaining portion of the third bottom electrode metal-containing portion, wherein the first diameter is greater than the second diameter, and the third diameter is equal to, or less than, the second diameter.

Referring now to FIG. 7, there is illustrated the exemplary structure of FIG. 6 after performing a second etch to provide a plurality of multilayered bottom electrodes 19S, wherein each multilayered bottom electrode 19S includes, from bottom to top, a tapered base segment, S1, having a first diameter and composed of a remaining portion of the first bottom electrode metal-containing layer 14L (hereinafter first bottom electrode metal-containing material 14), a middle segment, S2, having a second diameter and composed of a remaining portion of the second bottom electrode metal-containing layer 16L (hereinafter second bottom electrode metal-containing material 16), and an upper segment, S3, having a third diameter and composed of a remaining portion of the third bottom electrode metal-containing portion 18P (hereinafter third bottom electrode metal-containing material 18), wherein the first diameter is greater than the second diameter, and the third diameter is equal to, or less than, the second diameter.

By "tapered base segment" it is meant the base segment of each multilayered bottom electrode 19S has an outermost sidewall that slopes outward from the topmost surface of the base segment to the bottommost surface of the base segment. Stated in other terms, the tapered base segment, S1, of each multilayered bottom electrode is pyramidal in shape having an upper portion that has a width that is less than a width of a lower portion.

The second etch used in this step of the present application induces tapering. The second etch can be an ion beam etch (IBE) or a reactive ion etch (RIE). In one example, an IBE is used in which an ion beam is directed at a high angle (i.e., from 35° to 65°) relative to the vertical sidewall of each first patterned material stack such that etching is performed at such an angle. The ion beam can be rotated around each first patterned material stack to provide uniform 'patterning'. During the IBE, the third bottom electrode metal-containing portion 18P is trimmed, and the second bottom electrode metal-containing layer 16L and the first bottom electrode metal-containing layer 14L are etched to provide the multilayered bottom electrode 19S shown in FIG. 7. The upper segment, S3, and the middle segment, S2, of each multilayered bottom electrode 19S may be cylindrical in shape; although other asymmetric shapes are possible and can be used in the present application as the shape of upper segment, S3, and the middle segment, S2, of each multilayered bottom electrode 19S. In another example, a reactive ion etch (RIE) is used in which the parameters of the reactive ion etch induce tapering and provide the multilayered bottom electrode 19S of the present application.

In one embodiment of the present application, the first diameter of the tapered base segment, S1, of each multilayered bottom electrode 19S can be from 20 nm to 150 nm, the second diameter of the middle segment, S2, of each multilayered bottom electrode 19S can be from 7 nm to 120 nm, and the third diameter of the upper segment, S3, of each multilayered bottom electrode 19S can be from 6 nm to 110 nm. In the present application, the tapered base segment, S1, of each multilayered bottom electrode 19S has the first height mentioned above for the first bottom electrode metal-containing layer 14L, the middle segment, S2, of each multilayered bottom electrode 19S has the second height mentioned above for the second bottom electrode metal-containing layer 16L, and the upper segment, S3, of each multilayered bottom electrode 19S has the third height mentioned above for the third bottom electrode metal-containing layer 18L.

Each multilayered bottom electrode 19S typically has a high aspect ratio. By 'high aspect ratio' it is meant that the multilayered bottom electrode 19S has height to diameter ratio of greater than 2 to 1 (the height is the first height plus the second height plus the third height, while the diameter is determined from the diameter of the tapered lower segment S1, of each multilayered bottom electrode 19S). In one example, each multilayered bottom electrode 19S has an aspect ratio from 4:1 to 100:1. In some embodiments, each multilayered bottom electrode 19S can have an aspect ratio that is 2 to 1 or less (i.e., 1 to 1).

Each multilayered bottom electrode 19S directly contacts one of the underlying electrically conductive structures 12. Each multilayered bottom electrode 19S has a width that is less than a width of the underlying electrically conductive structure 12. The wider tapered base segment, S1, of each multilayered bottom electrode 19S prevents tilting and/or bowing of the resultant bottom electrode 19S. Thus, a stable bottom electrode 19S is provided.

After performing the second etch mentioned above, each dielectric hard mask material portion 20P and, if not previously removed, each patterned mask 22, can be removed utilizing one or more material removal processes. In one example, and when each patterned mask 22 is present during the second etch, each patterned mask 22 and each dielectric hard mask material portion 20P can be removed utilizing a planarization (i.e., chemical mechanical polishing (CMP) or grinding). In another example, and when each patterned mask 22 is present during the second etch, each patterned mask 22 can be removed utilizing a first material removal process (i.e., a chemical wet etch) and thereafter each dielectric hard mask material portion 20P can be removed utilizing a second material removal process such as planarization (i.e., chemical mechanical polishing (CMP) or grinding). In another embodiment, and when each patterned mask 22 has been removed prior to the second etch, each dielectric hard mask material portion 20 can be removed utilizing an etching process or a planarization process (i.e., chemical mechanical polishing (CMP) or grinding).

Figure 8:
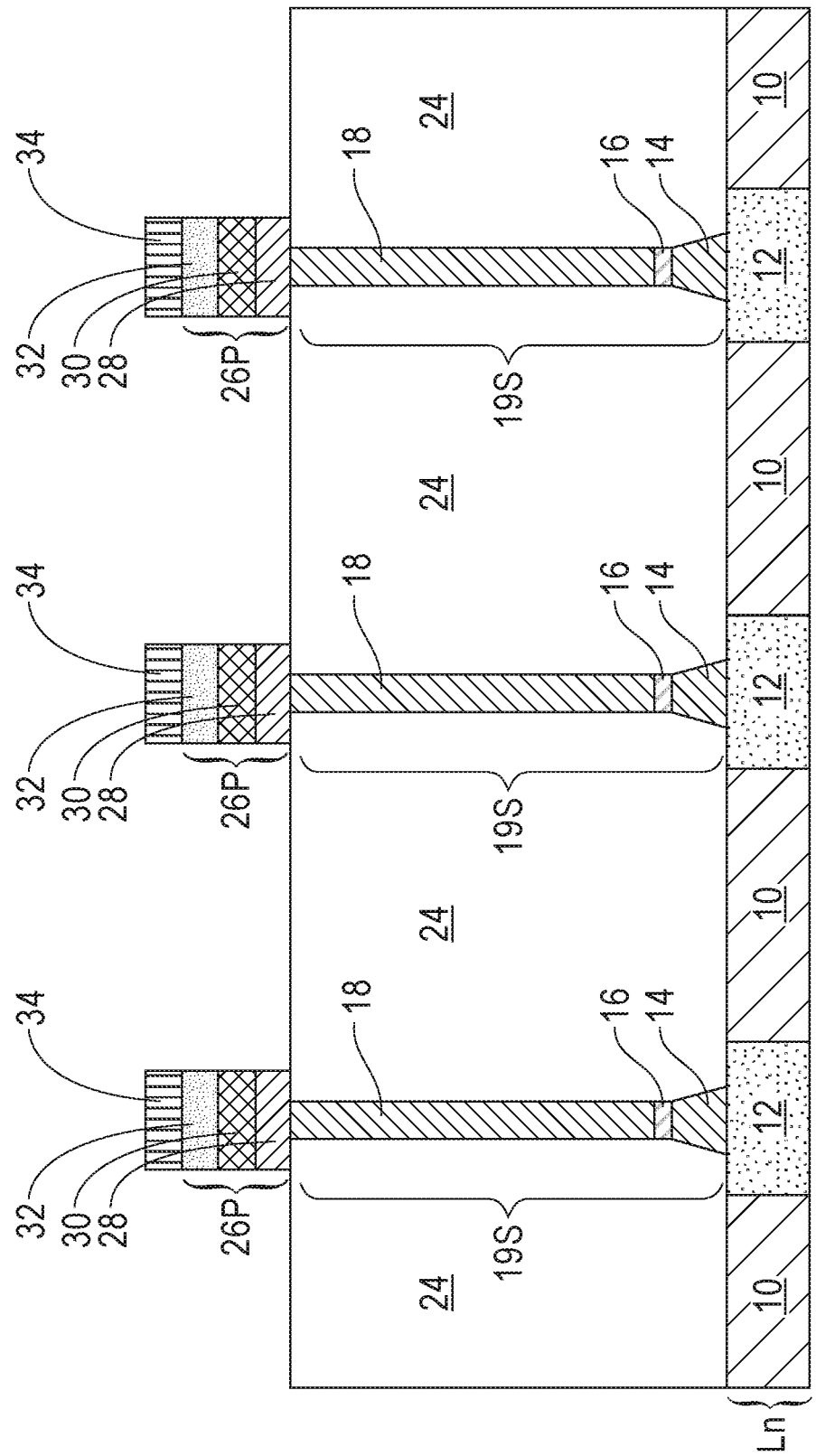
FIG. 8 is a cross sectional view of the exemplary structure of FIG. 7 after forming a second interconnect dielectric material layer laterally adjacent to each multilayered bottom electrode, and forming a plurality of second patterned material stacks on the second interconnect dielectric material layer, wherein each second patterned material stack contacts a topmost surface of the upper segment of one of the underlying bottom electrodes and includes a magnetic tunnel junction (MTJ) pillar and a top electrode.

Referring now to FIG. 8, there is illustrated the exemplary structure of FIG. 7 after forming a second interconnect dielectric material layer 24 laterally adjacent to each multilayered bottom electrode 19S, and forming a plurality of second patterned material stacks on the second interconnect dielectric material layer 24, wherein each second patterned material stack contacts a topmost surface of the upper segment, S3, of one of the underlying bottom electrodes 19S and includes a magnetic tunnel junction (MTJ) pillar 26P and a top electrode 34.

The second interconnect dielectric material layer 24, which is formed on the interconnect level, $L_n$, can be composed of one of the interconnect dielectric materials mentioned above for the first interconnect dielectric material layer 10. In one embodiment, the second interconnect dielectric material layer 24 is composed of an interconnect dielectric material that is compositionally the same as the interconnect dielectric material that provides the first interconnect dielectric material layer 10. In another embodiment, the second interconnect dielectric material layer 24 is composed of an interconnect dielectric material that is compositionally different from the interconnect dielectric material that provides the first interconnect dielectric material layer 10. The second interconnect dielectric material layer 24 can be formed utilizing one of the deposition processes mentioned above for forming the first interconnect dielectric material layer 10. A planarization process such as, for example, CMP, may follow the deposition of the interconnect dielectric material that provides the second interconnect dielectric material layer 24. The second interconnect dielectric material layer 24 has a topmost surface that is coplanar with a topmost surface of the upper segment S3 of each bottom electrode 19S.

After forming the second interconnect dielectric material layer 24, a MTJ material stack (not show) and a top electrode metal-containing layer (not shown) are formed. The MTJ material stack can include at least a magnetic pinned layer, a tunnel barrier layer, and a magnetic free layer. In some embodiments, the MTJ material stack is a bottom pinned MTJ material stack that includes, from bottom to top, a magnetic pinned layer, a tunnel barrier layer, and a magnetic free layer. An optional metal seed layer (not shown) can also be present in the bottom pinned MTJ material stack. In the bottom pinned MTJ material stack, the optional metal seed layer is formed beneath the magnetic pinned layer. The bottom pinned MTJ material stack can also include a non-magnetic spacer layer (not shown) located on the magnetic free layer, a second magnetic free layer (not shown) located on the non-magnetic spacer layer, and/or a MTJ cap layer (not shown) located on the magnetic free layer or on the second magnetic free layer.

In other embodiments, the MTJ material stack is a top pinned MTJ material stack that includes, from bottom to top, a magnetic free layer, a tunnel barrier layer, and a magnetic pinned layer. In such an embodiment, the top pinned MTJ material stack can also include an optional metal seed layer located beneath the magnetic free layer, a non-magnetic spacer layer located on the magnetic free layer, a second magnetic free layer located on the non-magnetic spacer layer, and/or a MTJ cap layer located on the magnetic pinned layer.

The various material layers of the MTJ material stack can be formed by utilizing one or more deposition processes such as, for example, sputtering, plasma enhanced atomic layer deposition (PEALD), plasma enhanced chemical vapor deposition (PECVD) or physical vapor deposition (PVD).

The optional metal seed layer can be composed of platinum (Pt), palladium (Pd), nickel (Ni), rhodium (Rh), iridium (Ir), rhenium (Re) or alloys and multilayers thereof. In one example, the optional metal seed layer is composed of platinum (Pt).

The magnetic pinned layer has a fixed magnetization. The magnetic pinned layer can be composed of a metal or metal alloy (or a stack thereof) that includes one or more metals exhibiting high spin polarization. In alternative embodiments, exemplary metals for the formation of the magnetic pinned layer include iron, nickel, cobalt, chromium, boron, or manganese. Exemplary metal alloys can include the metals exemplified by the above. In another embodiment, the magnetic pinned layer can be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that can be used include a metal such as cobalt, nickel, platinum, palladium, iridium, or ruthenium, and can be arranged as alternating layers. The strong PMA region can also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys can be arranged as alternating layers. In one embodiment, combinations of these materials and regions can also be employed as the magnetic pinned layer.

The tunnel barrier layer is composed of an insulator material and is formed at such a thickness as to provide an appropriate tunneling resistance. Exemplary materials for the tunnel barrier layer include magnesium oxide, aluminum oxide, and titanium oxide, or materials of higher electrical tunnel conductance, such as semiconductors or low-bandgap insulators.

The magnetic free layer can be composed of a magnetic material (or a stack of magnetic materials) with a magnetization that can be changed in orientation relative to the magnetization orientation of the magnetic pinned layer. Exemplary magnetic materials for the magnetic free layer include alloys and/or multilayers of cobalt, iron, alloys of cobalt-iron, nickel, alloys of nickel-iron, and alloys of cobalt-iron-boron.

If present, the non-magnetic metallic spacer layer is composed of a non-magnetic metal or metal alloy that allows magnetic information to be transferred therethrough and also permits the two magnetic free layers to couple together magnetically, so that in equilibrium the first and second magnetic free layers are always parallel. The non-magnetic metallic spacer layer allows for spin torque switching between the first and second magnetic free layers.

If present, the second magnetic free layer can include one of the magnetic materials mentioned above for magnetic free layer. In one embodiment, the second magnetic free layer is composed of a same magnetic material as the magnetic free layer. In another embodiment, the second magnetic free layer is composed of a magnetic material that is compositionally different from the magnetic free layer.

If present, the MTJ cap layer can be composed of Nb, NbN, W, WN, Ta, TaN, Ti, TiN, Ru, Mo, Cr, V, Pd, Pt, Rh, Sc, Al or other high melting point metals or conductive metal nitrides. The MTJ cap layer can have a thickness from 2 nm to 25 nm; other thicknesses are possible and can be used in the present application as the thickness of the MTJ cap layer.

The top electrode metal-containing layer can be composed of a conductive material such as, for example, Ta, TaN, Ti, TiN, Ru, RuN, RuTa, RuTaN, Co, CoWP, CoN, W, WN or any combination thereof. In one embodiment of the present application, top electrode metal-containing layer is composed of Ti/TiN. In the present application, the top electrode metal-containing layer can have a thickness that is from 100 nm to 500 nm; although other thicknesses are possible and can be used as the thickness of the top electrode metal-containing layer. The top electrode metal-containing layer can be formed by a deposition process such as, for example, sputtering, plasma enhanced atomic layer deposition (PEALD), plasma enhanced chemical vapor deposition (PECVD) or physical vapor deposition (PVD).

Next, the top electrode metal-containing layer and the MTJ material stack are patterned to provide the plurality of second patterned material stacks. As mentioned above, each second patterned material stack includes magnetic tunnel junction (MTJ) pillar 26P and top electrode 34. MTJ pillar 26P includes a remaining (i.e., non-etched) portion of the MTJ material stack. The top electrode 34 includes a remaining (i.e., non-etched) portion of top electrode metal-containing layer.

The patterning of the top electrode metal-containing layer and the MTJ material stack can include first forming a patterned mask (not shown) on a physically exposed surface of the top electrode metal-containing layer. In some embodiments, the patterned mask can be composed of a photolithographic resist stack. In one embodiment, the photolithographic resist stack that provides the patterned mask can include a bottom organic layer, a middle inorganic layer and a top resist layer. The bottom organic layer of the photolithographic resist stack can include an organic planarization layer (OPL). The bottom organic layer of the photolithographic resist stack can include a spun-on organic layer such as, for example, a Near Frictionless Carbon (NFC), a diamond-like carbon, a thermosetting polyarylene ether or polyimide. The middle inorganic layer of the photolithographic resist stack can include any oxide layer such as, for example, a low temperature (e.g., less than or equal to 250° C.) CVD oxide, an oxide derived from TEOS (tetraethylorthosilicate), a silicon oxide, a silane oxide, or a Si-containing anti-reflection coating material (SiARC). The top resist layer of the photolithographic resist stack can be composed of a resist material that provides for high resolution lithography patterning. The photolithographic resist stack can be formed be first providing a utilizing a series of deposition processes including first spin-on coating of the bottom organic layer, second spin-on coating of the middle inorganic layer, and third spin-on coating of the top resist layer. After providing the photolithographic resist stack, the top resist layer is patterned by photolithography (i.e., exposing the top resist layer to a pattern of irradiation and then developing the exposed top resist layer), and thereafter the pattern provided to the top resist layer is transferred into the underlying layers of the photolithographic resist stack providing patterned mask. The transferring can include one or more etching processes.

In some embodiments, patterning can include first patterning the top electrode metal-containing layer utilizing a first etching process such as, for example, a reactive ion etch, utilizing the patterned mask as an etch mask. The remaining, i.e., non-patterned, portion of the top electrode metal-containing layer provides the top electrode 34. The top electrode 34 can be cylindrical in shape; although other asymmetric shapes are possible and can be used in the present application as the shape of the top electrode 34. The critical dimension (CD) of the top electrode 34 can vary and is not critical in the present application.

After patterning the top electrode metal-containing layer, the patterned mask is removed from atop the top electrode 34 that is formed utilizing conventional processes well-known to those skilled in the art. The patterning of the MTJ material stack is then performed utilizing an ion beam etch (IBE) in which the top electrode 34 is employed as a patterned mask. The remaining, i.e., non-patterned, portion of the MTJ material stack provides the MTJ pillar 26P. In one example and as shown in FIG. 8, each MTJ pillar 26P includes, from bottom to top, a magnetic pinned material layer portion 28 (i.e., a remaining, unetched portion of the magnetic pinned material layer), a tunnel barrier layer portion 30 (i.e., a remaining, unetched portion of the tunnel barrier layer), and a magnetic free layer portion 32 (i.e., a remaining, unetched portion of the magnetic free layer). In another example (not shown), each MTJ pillar 26P includes, from bottom to top, a magnetic free layer portion, a tunnel barrier layer portion, and a magnetic pinned material layer portion. The MTJ pillar 26P can include remaining portions of any other layer that is present in the MTJ material stack. The MTJ pillar 26P can be cylindrical in shape; although other asymmetric shapes are possible and can be used in the present application as the shape of the MTJ pillar 26P; the MTJ pillar 26P and the top electrode 34 have a same shape. The critical dimension (CD) of the MTJ pillar 26P can vary and is not critical in the present application. The CD of the MTJ pillar 26P is typically the same as the CD of the top electrode 34. As is shown, the CD of the MTJ pillar 26P and the CD of the top electrode 34 are greater than the CD of the underlying top segment, S3, of the bottom electrode 19S. Collectively, the bottom electrode 19S, the MTJ pillar 26P, and the top electrode 34 provide a memory structure in accordance with the present application.

Figure 9:
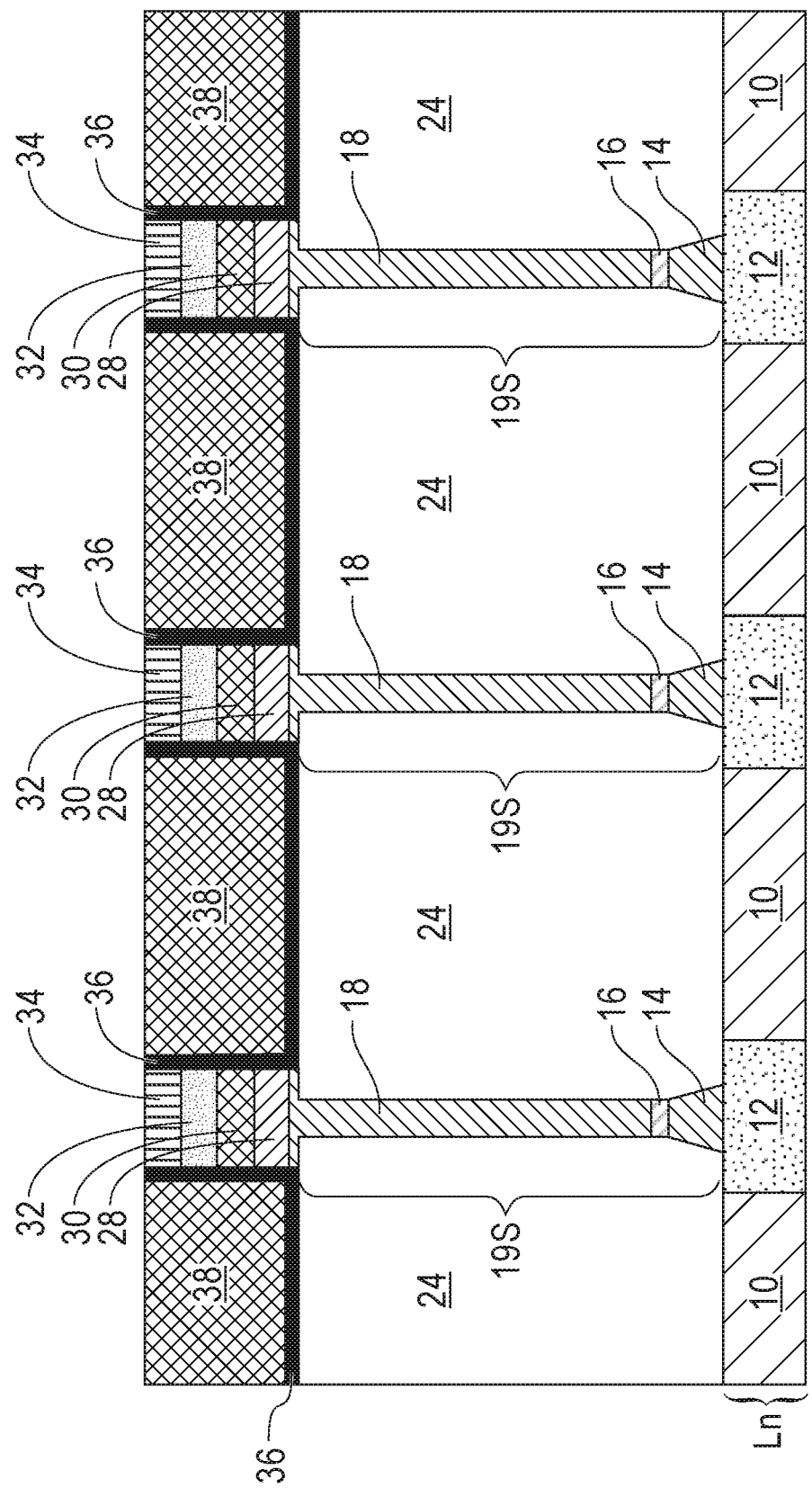
FIG. 9 is a cross sectional view of the exemplary structure of FIG. 8 after forming an encapsulation liner and a third interconnect dielectric material layer laterally adjacent to each second patterned material stack.

Referring now to FIG. 9, there is illustrated the exemplary structure of FIG. 8 after forming an encapsulation liner 36 and a third interconnect dielectric material layer 38 laterally adjacent to each second patterned material stack. The encapsulation liner 36 laterally surrounds the top electrode 34 and the MTJ pillar 26P. The third interconnect dielectric material layer 38 is located on the encapsulation liner 36 and fills in the gaps that are located between neighboring memory structures.

The encapsulation liner 36 is composed of a dielectric material that is compositionally different from the second interconnect dielectric material layer 24. The dielectric material that provides the encapsulation liner 36 may provide passivation to the top electrode 34 and the MTJ pillar 26P. In one embodiment, the encapsulation liner 36 is composed of silicon nitride. In another embodiment, the encapsulation liner 36 can be composed of a dielectric material that contains atoms of silicon, carbon and hydrogen. In some embodiments, and in addition to atoms of carbon and hydrogen, the dielectric material that provides the encapsulation liner 36 can include atoms of at least one of nitrogen and oxygen. In other embodiments, and in addition to atoms of silicon, nitrogen, carbon and hydrogen, the dielectric material that provides the encapsulation liner 36 can include atoms of boron. In one example, the encapsulation liner 36 can be composed of an nBLOK dielectric material that contains atoms of silicon, carbon, hydrogen, nitrogen and oxygen. In alternative example, the encapsulation liner 36 can be composed of a SiBCN dielectric material that contains atoms of silicon, boron, carbon, hydrogen, and nitrogen.

The encapsulation liner 36 can be formed by first deposition a continuous layer of the dielectric material that provides the encapsulation liner 36. During a subsequently performed planarization process that is used in forming the third interconnect dielectric material layer 38, the dielectric material that provides the encapsulation liner 36 is removed from a topmost surface of each of the top electrodes 34. The encapsulation liner 36 can have a thickness from 10 nm to 200 nm. Other thicknesses are possible and can be employed as the thickness of the encapsulation liner 36. The encapsulation liner 36 typically has a topmost surface that is coplanar with a topmost surface of the top electrodes 34.

The third interconnect dielectric material layer 38 can include one of the interconnect dielectric materials mentioned above. The interconnect dielectric material that provides the third interconnect dielectric material layer 38 can be compositionally the same as, or compositionally different from, the interconnect dielectric material that provides the first interconnect dielectric material layer 10 and/or the second interconnect dielectric material layer 24. The third interconnect dielectric material layer 38 can be formed utilizing a conventional deposition process including, for example, chemical vapor deposition (CVD), plasma enhanced chemical vapor deposition (PECVD) or spin-on coating. A planarization process such as, for example, chemical mechanical polishing (CMP), can follow the deposition of the interconnect dielectric material that provides the third interconnect dielectric material layer 38; as mentioned above this planarization steps also removes the dielectric material that provides the encapsulation liner 36 from the topmost surface of the top electrodes 34.

Referring is now made to FIG. 10, which illustrates an exemplary structure that can be employed in accordance with another embodiment of the present application. The exemplary structure of FIG. 10 includes a first bottom electrode metal-containing layer 50L located on a surface of an interconnect level, $L_n$, that includes electrically conductive structures 12 embedded in a first interconnect dielectric material layer 10. The interconnect level, $L_n$, including the first interconnect dielectric material layer 10 and the electrically conductive structures 12 is the same as that mentioned above for the exemplary structure shown in FIG. 1 of the present application.

Although not illustrated in the drawings, a metal level, as defined above, can be located beneath interconnect level, $L_n$, illustrated in FIG. 10. In some embodiments, and when n is 1, the metal level is a middle-of-the-line (MOL) level, as defined above. In other embodiments, and when n is 2, 3, 4, etc, the metal level is a lower interconnect level, as defined above, that is positioned beneath interconnect level, $L_n$. In either embodiment, the metal level includes a dielectric material layer (as defined above) that contains at least one metal level electrically conductive structure (as defined above) embedded therein that is connected, either directly or indirectly, to an underlying CMOS device (not shown) that is present in a front-end-of-the-line (FEOL) level (also not shown).

The first bottom electrode metal-containing layer 50L is formed on an entirety of the interconnect level, $L_n$. The first bottom electrode metal-containing layer 50L is composed of a first conductive material including, but are not limited to, Al, Ta, TaN, Ti, TiN, Ru, RuN, RuTa, RuTaN, Co, CoWP, CoN, W or WN. The first bottom electrode metal-containing layer 50L has a first thickness. In one example, the first bottom electrode metal-containing layer 50L is composed of Ru. The first bottom electrode metal-containing layer 50L can be formed by a deposition process such as, for example, sputtering, chemical vapor deposition (CVD), or plasma enhanced chemical vapor deposition (PECVD).

Referring now to FIG. 11, there is illustrated the exemplary structure of FIG. 10 after forming a second bottom electrode metal-containing layer 52L on the first bottom electrode metal-containing layer 50L, wherein the second bottom electrode metal-containing layer 52L has a higher lateral trim rate than the first bottom electrode metal-containing layer 50L. As is shown in FIG. 11, the second bottom electrode metal-containing layer 52L is a continuous layer that is formed on an entirety of the first bottom electrode metal-containing layer 50L. The term "lateral etch rate" denotes the speed in which a material is removed starting from an outer sidewall inward towards the interior of the material.

The second bottom electrode metal-containing layer 52L is composed of a second conductive material that is compositionally different from the first conductive material that provides the first bottom electrode metal-containing layer 50L. In the present application, the second conductive material is chosen to have a higher lateral etch rate than the first conductive material. Exemplary second conductive materials that can be used in providing the second bottom electrode metal-containing layer 52L include, but are not limited to, Al, Ta, TaN, Ti, TiN, Ru, RuN, RuTa, RuTaN, Co, CoWP, CoN, W or WN. The second bottom electrode metal-containing layer 52L has a second thickness that is equal to, less than or greater than, the first thickness. In one example, and when the first bottom electrode metal-containing layer 50L is composed of Ru, the second bottom electrode metal-containing layer 52L is composed of TaN. The second bottom electrode metal-containing layer 52L can be formed by a deposition process such as, for example, sputtering, chemical vapor deposition (CVD), or plasma enhanced chemical vapor deposition (PECVD).

Referring now to FIG. 12, there is illustrated the exemplary structure of FIG. 11 after forming a third bottom electrode metal-containing layer 54L on the second bottom electrode metal-containing layer 52L, wherein the third bottom electrode metal-containing layer 54L has a higher lateral trim rate than the second bottom electrode metal-containing layer 52L. As is shown in FIG. 12, the third bottom electrode metal-containing layer 54L is a continuous layer that is formed on an entirety of the second bottom electrode metal-containing layer 52L.

The third bottom electrode metal-containing layer 54L is composed of a third conductive material that is chosen to have a higher lateral trim rate than the second conductive material and the first conductive material. The third conductive material is thus compositionally different from the second conductive material that provides the second bottom electrode metal-containing layer 54L and compositionally different from the first conductive material that provides the first bottom electrode metal-containing layer 50L. Exemplary third conductive materials that can be used in providing the third bottom electrode metal-containing layer 54L include, but are not limited to, Al, Ta, TaN, Ti, TiN, Ru, RuN, RuTa, RuTaN, Co, CoWP, CoN, W or WN. The third bottom electrode metal-containing layer 54L has a third thickness, which can be equal to, less than or greater than the first and second thicknesses mentioned above. In one example, and when the first bottom electrode metal-containing layer 50L is composed of Ru and the second bottom electrode metal-containing layer 52L is composed of TaN, the third bottom electrode metal-containing layer 54L is composed of one of Ti, TiN or Al. The third bottom electrode metal-containing layer 54L can be formed by a deposition process such as, for example, sputtering, chemical vapor deposition (CVD), or plasma enhanced chemical vapor deposition (PECVD).

Figure 13:
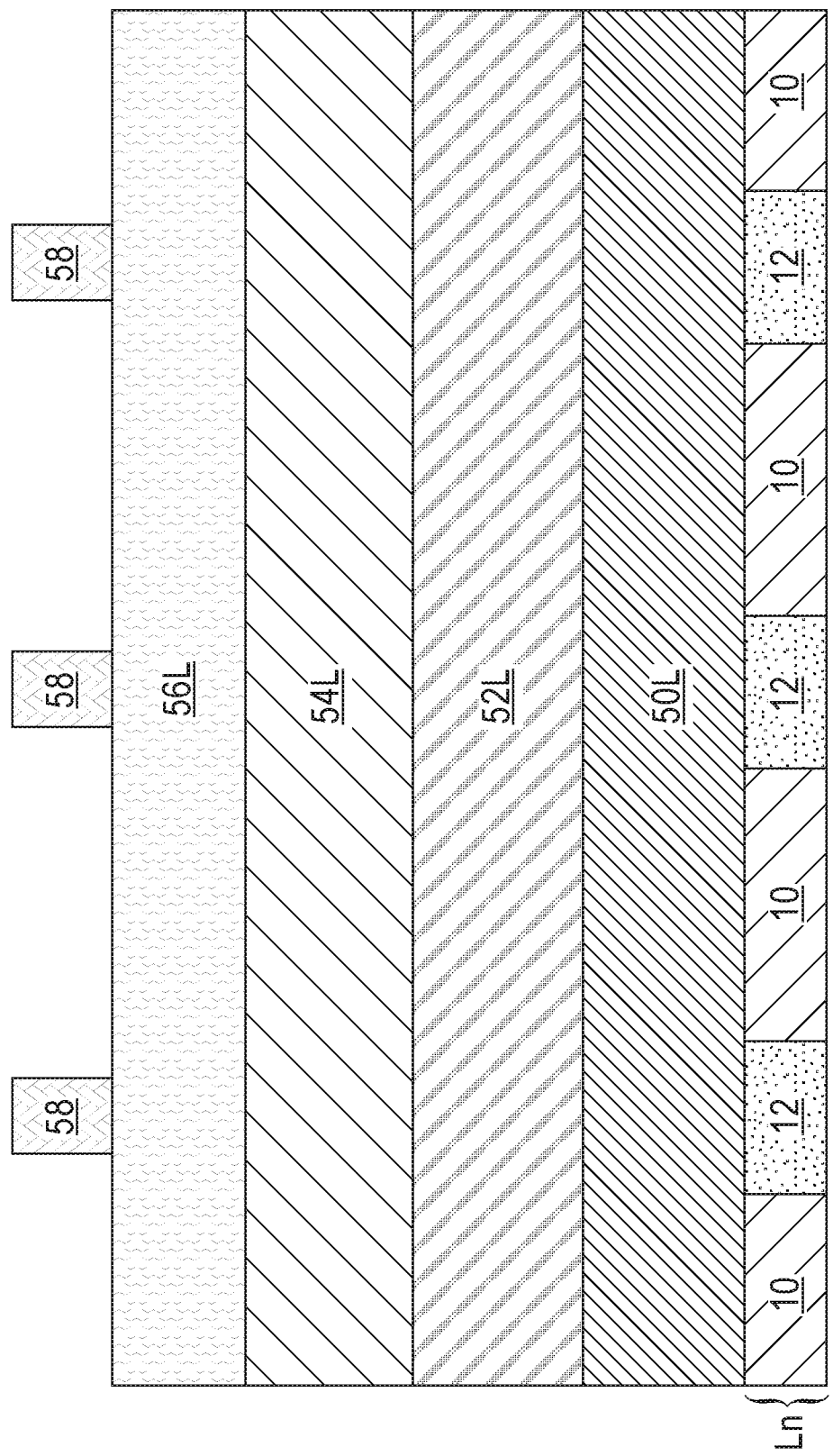
FIG. 13 is a cross sectional view of the exemplary structure of FIG. 12 after forming a dielectric hard mask layer on the third bottom electrode metal-containing layer, and after forming a plurality of patterned masks on the dielectric hard mask layer, wherein each patterned mask is located above one of the electrically conductive structures embedded in the first interconnect dielectric material layer.

Referring now to FIG. 13, there is illustrated the exemplary structure of FIG. 12 after forming a dielectric hard mask layer 56L on the third bottom electrode metal-containing layer 54L, and after forming a plurality of patterned masks 58 on the dielectric hard mask layer 56L, wherein each patterned mask 58 is located above one of the electrically conductive structures 12 embedded in the first interconnect dielectric material layer 10.

The dielectric hard mask layer 56L is a continuous layer that covers an entirety of the third bottom electrode metal-containing layer 54L. The dielectric hard mask layer 56L is composed of one of the dielectric hard mask materials mentioned above for dielectric hard mask layer 20L. The dielectric hard mask layer 56L can be formed utilizing one of the deposition process mentioned above in forming the dielectric hard mask layer 20L and dielectric hard mask layer 56L can have a thickness within the thickness range mentioned above for dielectric hard mask layer 20L.

The patterned masks 58 can be composed of one of the photoresist materials mentioned above for patterned masks 22. The patterned masks 58 can be formed utilizing the technique mentioned above in forming patterned mask 22.

Figure 14:
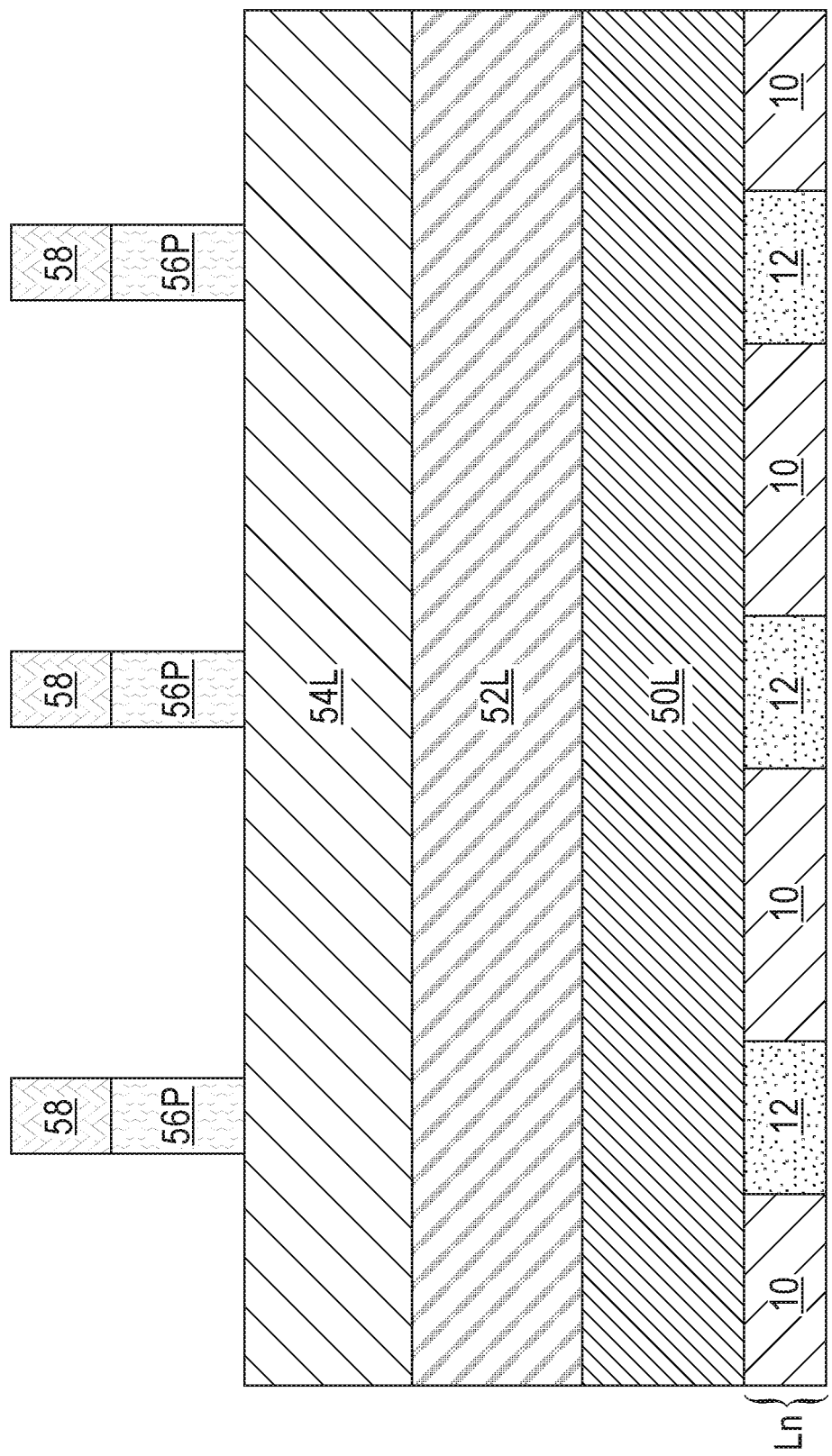
FIG. 14 is a cross sectional view of the exemplary structure of FIG. 13 after transferring the pattern provided by each patterned mask into the dielectric hard mask layer to provide a plurality of dielectric hard masks beneath each patterned mask.

Referring now to FIG. 14, there is illustrated the exemplary structure of FIG. 13 after transferring the pattern provided by each patterned mask 58 into the dielectric hard mask layer 56L to provide a plurality of dielectric hard masks 56P beneath each patterned mask 58. The transferring of the pattern provided by each patterned mask 58 into the dielectric hard mask layer 56L can be performed utilizing an etching process such as, for example, a plasma etch or a reactive ion etch. The etch used for the pattern transfer stops on the third bottom electrode metal-containing layer 54L.

Each dielectric hard mask 56P is composed of a remaining (i.e., non-etched portion of the dielectric hard mask layer 56L. Each dielectric hard mask 56P has an outermost sidewall that is vertically aligned to an outermost sidewall of one of the overlying patterned masks 58.

Figure 15:
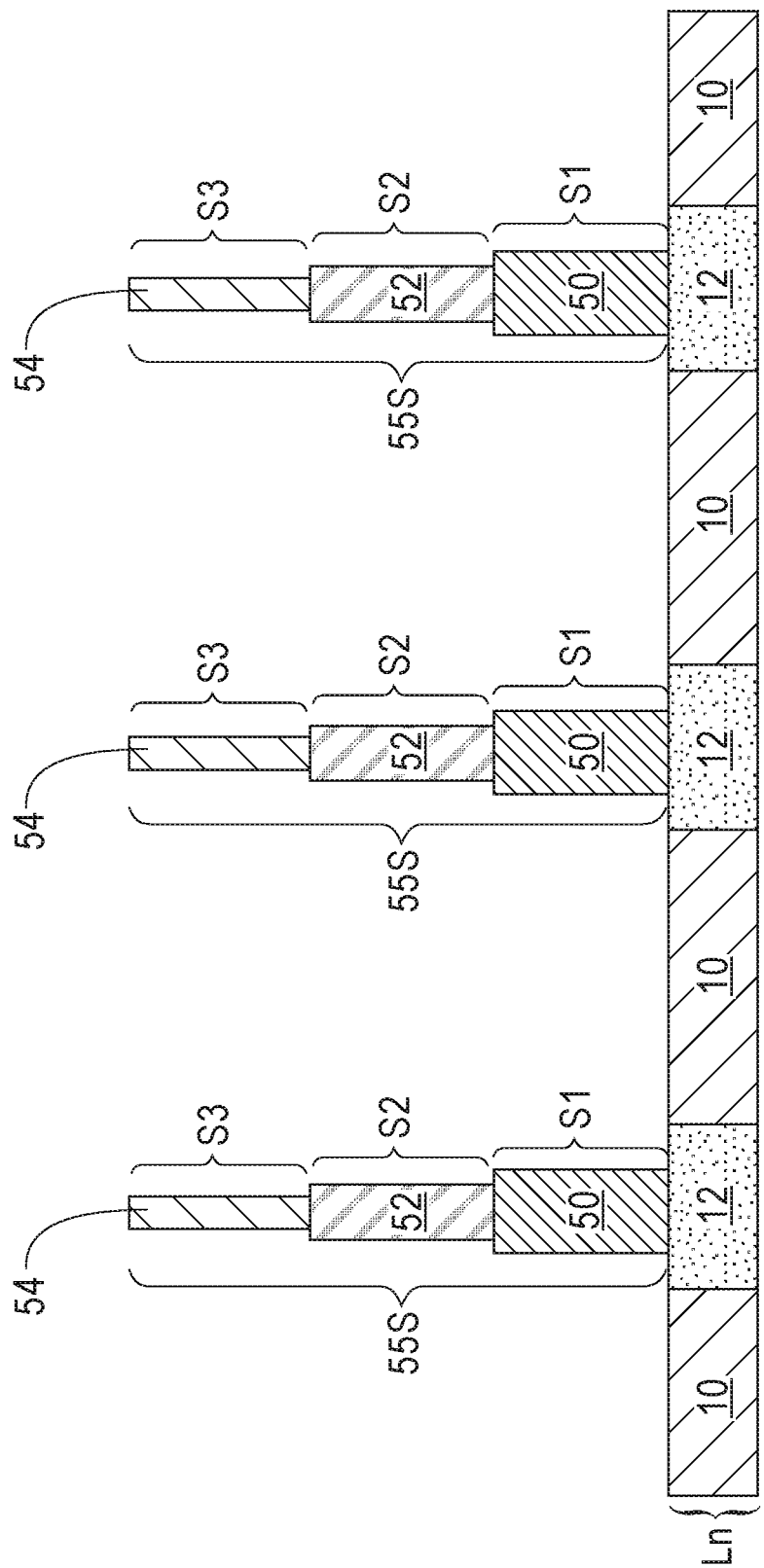
FIG. 15 is a cross sectional view of the exemplary structure of FIG. 14 after performing an etch utilizing each patterned hard mask as an etch mask to provide a plurality of multilayered bottom electrodes, wherein each multilayered bottom electrode includes, from bottom to top, a base segment having a first diameter and composed of a remaining portion of the first bottom electrode metal-containing layer, a middle segment having a second diameter and composed of a remaining portion of the second bottom electrode metal-containing layer, and an upper segment having a third diameter and composed of a remaining portion of the third bottom electrode metal-containing layer, wherein the first diameter is greater than the second diameter, and the third diameter is less than both the first diameter and the second diameter.

Each patterned mask 58 is typically removed after the pattern transfer step and prior to performing the etch described in FIG. 15. The removal of each patterned mask 58 can be performed utilizing a material removal process such as, for example, an etch or a planarization process (i.e., chemical mechanical polishing or grinding).

Referring now to FIG. 15, there is illustrated the exemplary structure of FIG. 14 after performing an etch utilizing each patterned hard mask 56 as an etch mask to provide a plurality of multilayered bottom electrodes 55S, wherein each multilayered bottom electrode 55S includes, from bottom to top, a base segment, S1, having a first diameter and composed of a remaining portion of the first bottom electrode metal-containing layer 50L (hereinafter first bottom electrode metal-containing material 50), a middle segment, S2, having a second diameter and composed of a remaining portion of the second bottom electrode metal-containing layer 52L (hereinafter second bottom electrode metal-containing material S2), and an upper segment, S3, having a third diameter and composed of a remaining portion of the third bottom electrode metal-containing layer 54L (hereinafter third bottom electrode metal-containing material 54), wherein the first diameter is greater than the second diameter, and the third diameter is less than both the first diameter and the second diameter. The wider base segment, S1, of each multilayered bottom electrode 55S prevents tilting and/or bowing of the resultant bottom electrode 55S. Thus, a stable bottom electrode 55S is provided.

In the present application, the base segment, S1, of the multilayered bottom electrode 55S has a greater critical dimension (CD) than the middle segment, S2, of the multilayered bottom electrode 55S, and the middle segment, S2, of the multilayered bottom electrode 55S has greater critical dimension (CD) than the upper segment, S3, of the multilayered bottom electrode 55S.

In this embodiment, the etch used in providing each multilayered bottom electrode 55S can include IBE or RIE. The upper segment, S3, the middle segment, S2, and the base segment, S1, of each multilayered bottom electrode 55S may be cylindrical in shape; although other asymmetric shapes are possible and can be used in the present application as the shape of upper segment, S3, the middle segment, S2, and the base segment, S1, of each multilayered bottom electrode 55S.

In one embodiment of the present application, the first diameter of the base segment, S1, of each multilayered bottom electrode 55S can be from 20 nm to 150 nm, the second diameter of the middle segment, S2, of each multilayered bottom electrode 55S can be from 7 nm to 120 nm, and the third diameter of the upper segment, S3, of each multilayered bottom electrode 55S can be from 6 nm to 110 nm. In the present application, the base segment, S1, of each multilayered bottom electrode 55S has the first height mentioned above for the first bottom electrode metal-containing layer 50L, the middle segment, S2, of each multilayered bottom electrode 55S has the second height mentioned above for the second bottom electrode metal-containing layer 52L, and the upper segment, S3, of each multilayered bottom electrode 55S has the third height mentioned above for the third bottom electrode metal-containing layer 54L.

Each multilayered bottom electrode 55S typically has a high aspect ratio. By 'high aspect ratio' it is meant that the multilayered bottom electrode 55S has height to diameter ratio of greater than 2 to 1 (the height is the first height plus the second height plus the third height, while the diameter is determined from the diameter of the lower segment S1, of each multilayered bottom electrode 55S). In one example, each multilayered bottom electrode 55S has an aspect ratio from 4:1 to 100:1. In some embodiments, each multilayered bottom electrode 55S can have an aspect ratio that is 2 to 1 or less (i.e., 1 to 1).

Each multilayered bottom electrode 55S directly contacts one of the underlying electrically conductive structures 12. Each multilayered bottom electrode 55S has a width that is less than a width of the underlying electrically conductive structure 12.

Each patterned hard mask 56P is removed after the performing the etch that provides the multilayered bottom electrodes 55S. The removal of each patterned hard mask 56P can be performed utilizing a material removal process such as, for example, an etch or a planarization process (i.e., chemical mechanical polishing or grinding).

Figure 16:
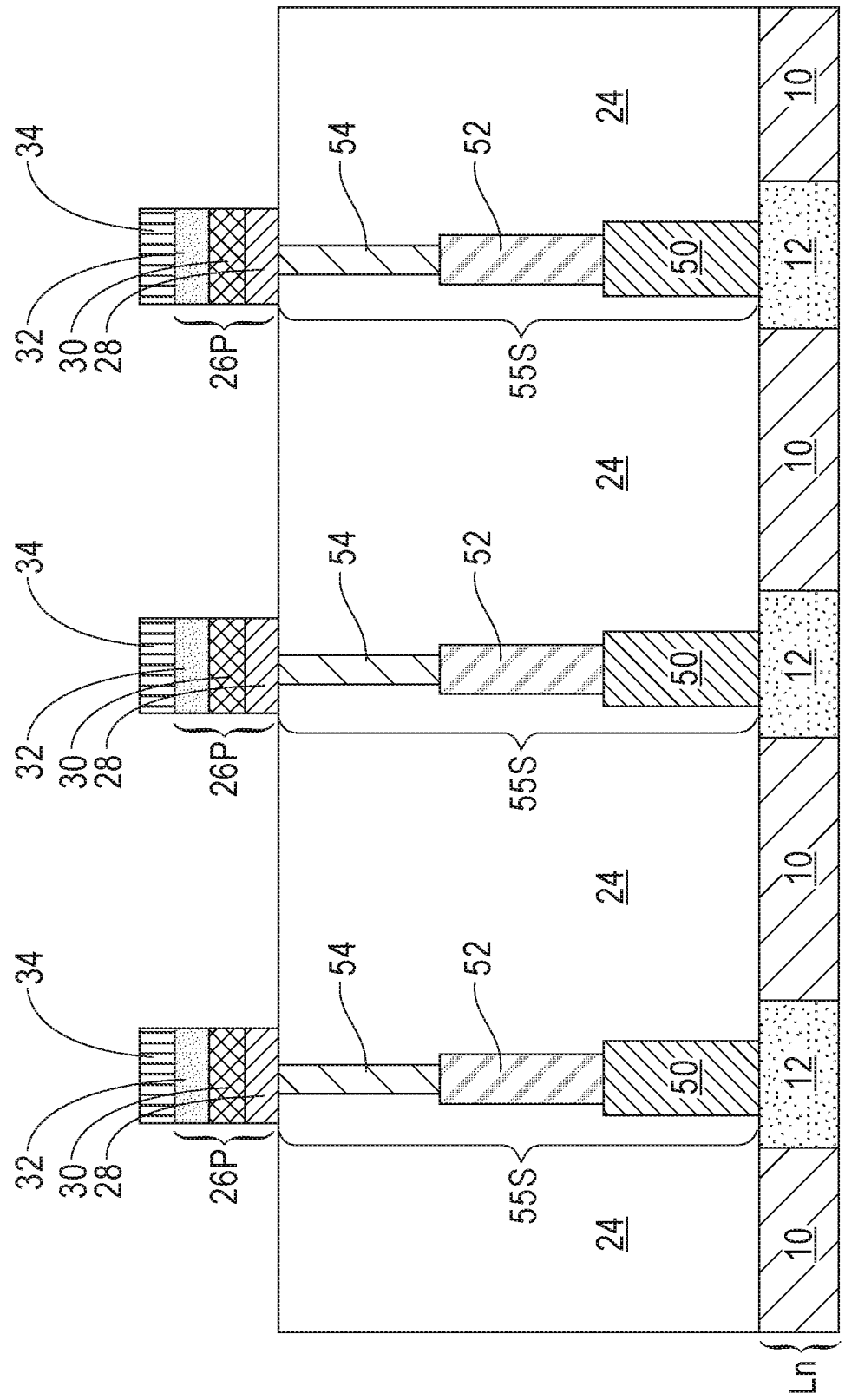
FIG. 16 is a cross sectional view of the exemplary structure of FIG. 15 after forming a second interconnect dielectric material layer laterally adjacent to each multilayered bottom electrode, and forming a plurality of patterned material stacks on the second interconnect dielectric material layer, wherein each patterned material stack contacts a topmost surface of the upper segment of one of the underlying bottom electrodes and includes a magnetic tunnel junction (MTJ) pillar and a top electrode.

Referring now to FIG. 16, there is illustrated the exemplary structure of FIG. 15 after forming a second interconnect dielectric material layer 24 laterally adjacent to each multilayered bottom electrode 55S, and forming a plurality of patterned material stacks on the second interconnect dielectric material layer 24, wherein each patterned material stack contacts a topmost surface of the upper segment, S3, of one of the underlying bottom electrodes 55S and includes a magnetic tunnel junction (MTJ) pillar 26P and a top electrode 32.

The second interconnect dielectric material layer 24 of this embodiment of the present application is the same as the second interconnect dielectric material layer 24 mentioned above in regard to the exemplary structure shown in FIG. 8. The MTJ pillar 26P and the top electrode 32 of this embodiment of the present application are the same as those mentioned above in regarding to the MTJ pillar 26P and the top electrode 32 mentioned above for the exemplary structure shown in FIG. 8. Thus, the various materials and processing mentioned above for the second interconnect dielectric material layer 24 and the MTJ pillar 26P and the top electrode 32 are applicable here for this embodiment of the present application.

Figure 17:
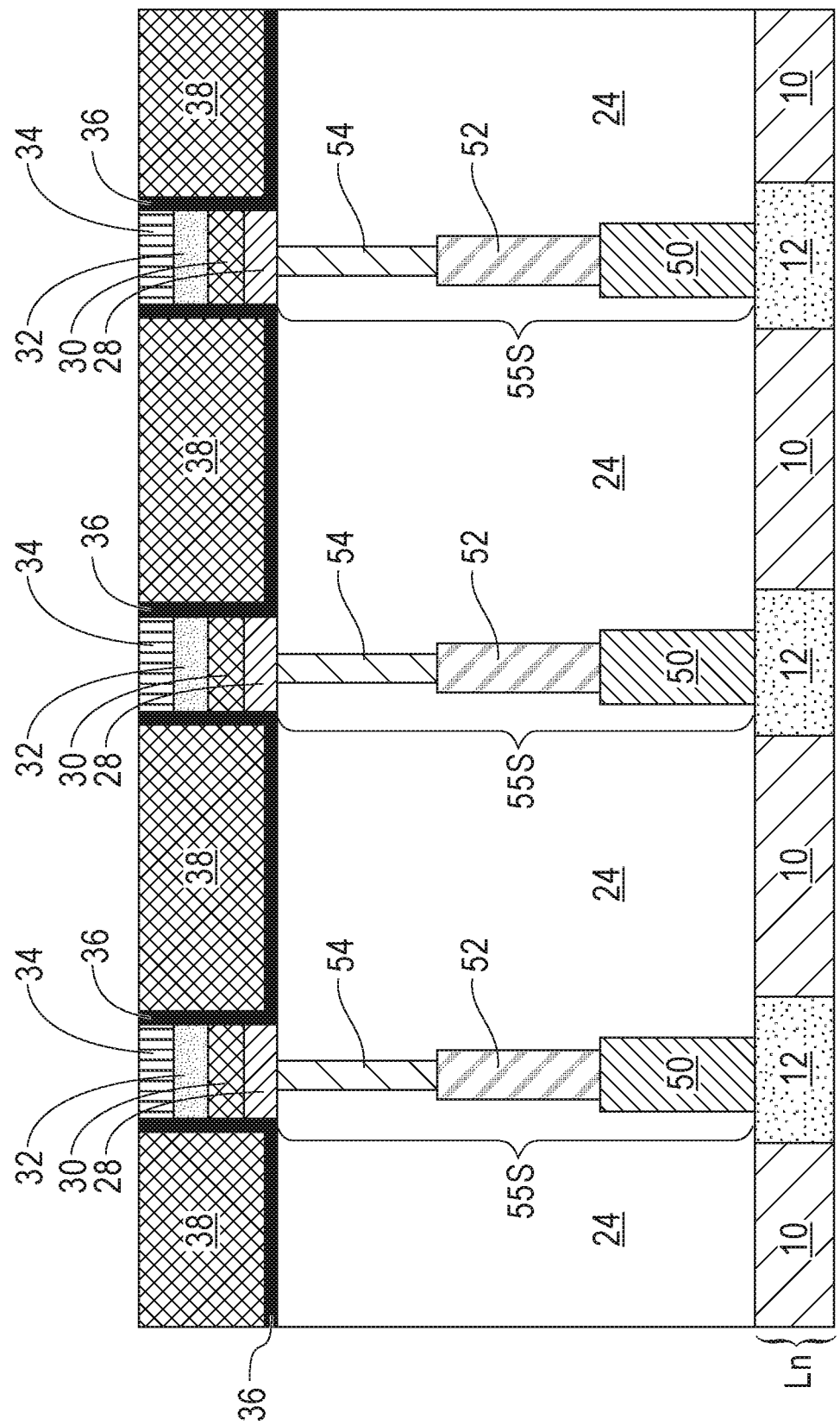
FIG. 17 is a cross sectional view of the exemplary structure of FIG. 16 after forming an encapsulation liner and a third interconnect dielectric material layer laterally adjacent to each patterned material stack.

Referring now to FIG. 17, there is illustrated the exemplary structure of FIG. 16 after forming an encapsulation liner 36 and a third interconnect dielectric material layer 38 laterally adjacent to each patterned material stack (i.e., the MTJ pillar 26P and the top electrode 32).

The encapsulation liner 36 and the third interconnect dielectric material layer 38 of this embodiment of the present application are the same as the encapsulation liner 36 and the third interconnect dielectric material layer 38 mentioned above in regard to the exemplary structure shown in FIG. 9. Thus, the various materials and processing mentioned above for the encapsulation liner 36 and the third interconnect dielectric material layer 38 are applicable here for this embodiment of the present application.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A memory structure comprising:
   a multilayered bottom electrode located on a surface of an electrically conductive structure that is embedded in a first interconnect dielectric material layer, wherein the multilayered bottom electrode includes a base segment having a first diameter and composed of a first conductive material, a middle segment having a second diameter and composed of a second conductive material that is compositionally different from the first conductive material, and an upper segment having a third diameter and composed of a third conductive material that is compositionally different from the first conductive material and the second conductive material wherein the first diameter is greater than the second diameter, and the third diameter is less than both the first diameter and the second diameter;
   a second interconnect dielectric material layer laterally adjacent to the multilayered bottom electrode, wherein the second interconnect dielectric material layer contacts a topmost surface of both the base segment and the middle segment of the multilayered bottom electrode;
   a magnetic tunnel junction (MTJ) pillar located on a topmost surface of the upper segment of the multilayered bottom electrode; and
   a top electrode located on the MTJ pillar.

2. The memory structure of claim 1, wherein the first diameter is from 20 nm to 150 nm, the second diameter is from 7 nm to 120 nm, and the third diameter is from 6 nm to 110 nm.

3. The memory structure of claim 1, wherein the MTJ pillar is composed of a top pinned MTJ material stack.

4. The memory structure of claim 1, wherein the MTJ pillar is composed of a bottom pinned MTJ material stack.

5. The memory structure of claim 1, wherein the MTJ pillar and the top electrode have a same critical dimension, and the critical dimension of the MTJ pillar and the top electrode is larger than a critical dimension of the upper segment of the multilayered bottom electrode.

6. The memory structure of claim 5, further comprising an encapsulation liner and a third interconnect dielectric material layer laterally adjacent to the MTJ pillar and the top electrode, wherein the encapsulation liner contacts sidewalls of both the MTJ pillar and the top electrode and the third interconnect dielectric material layer is located on the encapsulation liner.

7. The memory structure of claim 1, wherein the second interconnect dielectric material layer has a topmost surface that is coplanar with the topmost surface of the upper segment of the multilayered bottom electrode.

8. The memory structure of claim 1, wherein the MTJ pillar is located entirely above the second interconnect dielectric material layer.

9. The memory structure of claim 1, wherein the MTJ pillar has a bottommost surface that extends onto a topmost surface of the second interconnect dielectric material layer.

\* \* \* \* \*